(12) United States Patent
Zhu et al.

(10) Patent No.: US 11,985,811 B2
(45) Date of Patent: May 14, 2024

(54) SEMICONDUCTOR MEMORY DEVICE, MANUFACTURING METHOD THEREOF AND ELECTRONIC DEVICE

(71) Applicant: Beijing Superstring Academy of Memory Technology, Beijing (CN)

(72) Inventors: Zhengyong Zhu, Beijing (CN); Bokmoon Kang, Beijing (CN); Guilei Wang, Beijing (CN); Chao Zhao, Beijing (CN)

(73) Assignee: Beijing Superstring Academy of Memory Technology (CN)

( * ) Notice: Subject to any disclaimer, the term of this patent is extended or adjusted under 35 U.S.C. 154(b) by 0 days.

(21) Appl. No.: 18/141,107

(22) Filed: Apr. 28, 2023

(65) Prior Publication Data
US 2023/0320071 A1 Oct. 5, 2023

Related U.S. Application Data

(63) Continuation of application No. PCT/CN2022/096933, filed on Jun. 2, 2022.

(30) Foreign Application Priority Data

Apr. 2, 2022 (CN) .......................... 202210351841.1

(51) Int. Cl.
H10B 12/00 (2023.01)

(52) U.S. Cl.
CPC ............. H10B 12/30 (2023.02); H10B 12/03 (2023.02); H10B 12/05 (2023.02)

(58) Field of Classification Search
CPC ........ H10B 12/03; H10B 12/05; H10B 12/30; H10B 12/395; H01L 29/7869; H01L 29/78642
See application file for complete search history.

(56) References Cited

U.S. PATENT DOCUMENTS

| 4,920,389 A | * | 4/1990 | Itoh | ...................... | H10B 12/395 |
| | | | | | 257/302 |
| 5,449,630 A | * | 9/1995 | Lur | ........................ | H10B 12/37 |
| | | | | | 438/386 |

(Continued)

FOREIGN PATENT DOCUMENTS

| CN | 1491442 A | 4/2004 |
| CN | 1645618 A | 7/2005 |

(Continued)

OTHER PUBLICATIONS

Notice of Allowance for Chinese Application No. 202210351841.1 issued Oct. 21, 2022. 5 pgs.

(Continued)

*Primary Examiner* — Nicholas J Tobergte
*Assistant Examiner* — Kevin Quinto
(74) *Attorney, Agent, or Firm* — Lerner David LLP

(57) ABSTRACT

A semiconductor memory device and a manufacturing method thereof, a reading/writing method, an electronic device and a memory circuit are provided. A transistor is provided in each memory cell in the semiconductor memory device. A gate electrode and an auxiliary electrode are provided in the transistor, and the auxiliary electrode is electrically connected to a drain electrode. During a writing operation, a first voltage is applied to the gate electrode through a word line, and an electrical signal is applied to a source electrode through a bit line according to the external input data. During a reading operation, a second voltage is applied to the auxiliary electrode through the word line by using the influence of the voltage on the auxiliary electrode on the threshold voltage of the transistor (the size of the second voltage is between the threshold voltage of the transistor when storing "1" and the threshold voltage of the transistor when storing "0"), and then the data is read by (Continued)

detecting the size of the output current of the field effect transistor.

18 Claims, 15 Drawing Sheets

(56) References Cited

U.S. PATENT DOCUMENTS

| | | |
|---|---|---|
| 2001/0016381 A1 | 8/2001 | Jun |
| 2002/0114191 A1 | 8/2002 | Iwata et al. |
| 2004/0241987 A1 | 12/2004 | Kim et al. |
| 2006/0054958 A1 | 3/2006 | Weis et al. |
| 2008/0099811 A1 | 5/2008 | Tak et al. |
| 2008/0203443 A1 | 8/2008 | Wilson et al. |
| 2009/0185426 A1 | 7/2009 | Wang et al. |
| 2011/0156025 A1 | 6/2011 | Shionoiri et al. |
| 2021/0366985 A1* | 11/2021 | Lin .................... H10N 70/8836 |
| 2022/0384444 A1 | 12/2022 | Chiang et al. |

FOREIGN PATENT DOCUMENTS

| | | |
|---|---|---|
| CN | 101494222 A | 7/2009 |
| CN | 105047669 A | 11/2015 |
| CN | 113380290 A | 9/2021 |
| TW | 200836328 A | 9/2008 |
| WO | 2017111798 A1 | 6/2017 |

OTHER PUBLICATIONS

International Search Report for PCT/CN2022/096933 mailed Nov. 28, 2022. 5 pgs. (see p. 3 & 5, categorizing the cited references).

* cited by examiner

SEMICONDUCTOR MEMORY DEVICE, MANUFACTURING METHOD THEREOF AND ELECTRONIC DEVICE

CROSS REFERENCE TO RELATED APPLICATIONS

The present disclosure is a continuation of PCT International Application No. PCT/CN2022/096933, filed on Jun. 2, 2022, which claims priority of a Chinese patent application No. 202210351841.1, filed on Apr. 2, 2022 in the CNIPA, the disclosure of which is incorporated by reference herein in its entirety.

TECHNICAL FIELD

The present disclosure relates to a technical field of semiconductor devices, and in particular to a semiconductor memory device, a manufacturing method thereof and a reading/writing method thereof, an electronic device, and a memory circuit.

BACKGROUND

Dynamic random access memories (DRAMs) are a kind of semiconductor memory devices. Compared with static semiconductor memories, DRAM semiconductor memory devices have the advantages of simpler structure, lower manufacturing cost, higher capacity density, etc. With the development of technology, DRAM semiconductor memory devices are widely used increasingly.

However, the existing DRAM semiconductor memory devices have the disadvantages of complex structure and low integration. As a result, the application of DRAM semiconductor memory devices is limited.

SUMMARY

The present disclosure provides a semiconductor memory device, a manufacturing method thereof and a reading/writing method thereof, an electronic device and a memory circuit, in order to reduce the leakage current possibly generated in a reading/writing state while ensuring high integration of the device, such that the semiconductor memory device has a compact structure and improve storage performance.

In accordance with one embodiment of the present disclosure, a semiconductor memory device is provided, including a substrate and a plurality of memory cells arranged on the substrate, each of the memory cells including a transistor, a bit line and a word line, wherein the transistor includes: a drain electrode, which is arranged above the substrate; a gate electrode, which is arranged above the drain electrode, the gate electrode being insulated from the drain electrode, the gate electrode being electrically connected to the word line; an auxiliary electrode, which is arranged around an outer sidewall of the gate electrode above the drain electrode, the auxiliary electrode being insulated from the gate electrode, the auxiliary electrode being not overlapped with the gate electrode in a first direction perpendicular to an upper surface of the substrate, the auxiliary electrode being electrically connected to the drain electrode; a semiconductor layer, the semiconductor layer surrounding the gate electrode, the semiconductor layer being insulated from the gate electrode and the auxiliary electrode, respectively, the semiconductor layer being electrically connected to the drain electrode; and, a source electrode, which is arranged around the outer sidewall of the gate electrode above the auxiliary electrode, the source electrode being electrically connected to the semiconductor layer and the bit line, respectively, the source electrode being insulated from the gate electrode and the auxiliary electrode, respectively.

In one embodiment, the auxiliary electrode may be at least partially overlapped with the source electrode in the first direction.

In one embodiment, the auxiliary electrode may be at least partially overlapped with the drain electrode in the first direction.

In one embodiment, an orthographic projection of the outer sidewall of the auxiliary electrode on a plane parallel to the upper surface of the substrate mat be located outside an orthographic projection of the source electrode on the plane, and may be located within an orthographic projection of the drain electrode on the plane.

In one embodiment, the semiconductor layer may be arranged between the gate electrode and the auxiliary electrode.

In one embodiment, the semiconductor memory device may further include a conductive connector, and the auxiliary electrode may be electrically connected to the drain electrode through the conductive connector.

In one embodiment, the conductive connector may surround the auxiliary electrode.

In one embodiment, the semiconductor layer may include a monocrystalline semiconductor material, a polycrystalline semiconductor material or a metal oxide semiconductor.

In one embodiment, the metal oxide semiconductor may contain at least one of In, Ga, Zn, Sn and W.

In one embodiment, the semiconductor memory device may include a plurality of stacked array modules, and each of the array modules includes a plurality of memory cells arranged in an array; the gate electrodes of the transistors in each row are connected to one of the word lines; and, the source electrodes of the transistors in each column are connected to one of the bit lines.

In accordance with another embodiment of the present disclosure, a semiconductor memory device is provided, including: a gate electrode, which is arranged on a substrate, extends in a first direction perpendicular to an upper surface of the substrate and is cylindrical, the gate electrode being electrically connected to a word line; a semiconductor layer, at least a portion of which surrounds a sidewall of the gate electrode; a source electrode, which is arranged around an outer sidewall of the semiconductor layer and electrically connected to the semiconductor layer, the source electrode being electrically connected to a bit line; a drain electrode, which is arranged in a lower portion of the semiconductor layer to be electrically connected to the semiconductor layer, the drain electrode being spaced apart from the source electrode in the first direction; a first insulating layer, which is arranged between the gate electrode and the semiconductor layer and between the gate electrode and the drain electrode; an auxiliary electrode, which is arranged around the outer sidewall of the semiconductor layer between the source electrode and the drain electrode in the first direction; and, a second insulating layer, which is located between the auxiliary electrode and the semiconductor layer and between the auxiliary electrode and the source electrode such that the auxiliary electrode is insulated from both the semiconductor layer and the source electrode, wherein the auxiliary electrode is electrically connected to the drain electrode.

In one embodiment, the auxiliary electrode may extend from the source electrode to the drain electrode in the first direction.

In one embodiment, the auxiliary electrode may be at least partially overlapped with the drain electrode in the first direction.

In one embodiment, an orthographic projection of the outer sidewall of the auxiliary electrode on a plane parallel to the upper surface of the substrate may be located outside an orthographic projection of the source electrode on the plane, and may be located within an orthographic projection of the drain electrode on the plane.

In one embodiment, the semiconductor layer may surround the sidewall of the gate electrode and the lower surface of the gate electrode in a U-like shape, and the first insulating layer may be formed between the semiconductor layer and the gate electrode in a U-like shape to insulate the semiconductor layer from the gate electrode.

In one embodiment, the drain electrode may be arranged to surround a lower portion of the outer sidewall of the semiconductor layer and contact with the lower portion of the outer sidewall of the semiconductor layer.

In one embodiment, the drain electrode may be located between the substrate and the semiconductor layer and contact with the lower surface of the semiconductor layer.

In one embodiment, the drain electrode may include a first portion located between the substrate and the semiconductor layer and a second portion extending outward from the first portion in a second direction parallel to the upper surface of the substrate, and the second portion of the drain electrode may be at least partially overlapped with the auxiliary electrode in the first direction.

In one embodiment, the second portion of the drain electrode may directly contact with the auxiliary electrode.

In one embodiment, the auxiliary electrode may be spaced apart from the second portion of the drain electrode in the first direction through the second insulating layer, and the auxiliary electrode may be electrically connected to the second portion of the drain electrode through a conductive connector.

In one embodiment, the conductive connector may surround the outer sidewall of the semiconductor layer in a ring shape, and may extend in the first direction to be connected to the second portion of the drain electrode.

In one embodiment, an orthographic projection of the conductive connector on the plane parallel to the upper surface of the substrate may be located within the orthographic projection of the auxiliary electrode on the plane.

In one embodiment, the conductive connector may electrically connect a portion of the outer sidewall of the auxiliary electrode to the end of the second portion of the drain electrode, wherein the orthographic projection of the conductive connector on the plane parallel to the upper surface of the substrate may be located outside the orthographic projection of the auxiliary electrode on the plane.

In one embodiment, the word line and the bit line are located above the gate electrode and insulated from each other in different layers.

In one embodiment, the source electrode may be at least partially overlapped with the auxiliary electrode in the first direction.

In one embodiment, the semiconductor memory device may further include an additional electrode at least partially overlapped with the auxiliary electrode in the first direction.

In accordance with another embodiment of the present disclosure, a memory circuit is provided, including a gate electrode, an auxiliary electrode, a source electrode, a drain electrode, a word line and a bit line, the gate electrode being electrically connected to the word line, the source electrode being electrically connected to the bit line, the drain electrode being electrically connected to the auxiliary electrode, the gate electrode being insulated from the auxiliary electrode, the gate electrode being insulated from the source electrode and the drain electrode, respectively, the auxiliary electrode being insulated from the source electrode and the drain electrode, respectively, and a node capacitor of the auxiliary electrode with the drain electrode forming a storage capacitor.

In accordance with another embodiment of the present disclosure, an electronic device including the semiconductor memory device described above is provided.

In accordance with another embodiment of the present disclosure, a method for manufacturing a semiconductor memory device is provided, including steps of: providing a substrate; forming a drain electrode above the substrate by a patterning process; forming a source electrode, a semiconductor layer and a gate electrode above the drain electrode in sequence; and, forming an auxiliary electrode and a conductive connector above the drain electrode, the auxiliary electrode being not overlapped with the gate electrode in a first direction perpendicular to an upper surface of the substrate, the conductive connector being electrically connected to the auxiliary electrode and the drain electrode, respectively.

In one embodiment, the forming a source electrode, a semiconductor layer and a gate electrode above the drain electrode in sequence includes: forming a sacrificial layer above the drain electrode, the sacrificial layer covering the drain electrode; forming a source electrode above the sacrificial layer by a patterning process; forming a first dielectric layer on the source electrode, the first dielectric layer covering the source electrode and the drain electrode; forming a through hole in sequence penetrating through the first dielectric layer, the source electrode and the sacrificial layer, the bottom of the through hole exposing the drain electrode, the hole wall of the through hole exposing the source electrode; and, forming a semiconductor layer, a first insulating layer and a gate electrode in the through hole in sequence, the semiconductor layer being electrically connected to the source electrode and the drain electrode, respectively.

In one embodiment, the forming an auxiliary electrode and a conductive connector on one side of the drain electrode away from the substrate includes: removing the first dielectric layer and a portion of the sacrificial layer by a patterning process, such that two ends of the drain electrode are exposed; removing the remaining sacrificial layer to form an accommodating space so as to expose the drain electrode, the source electrode and the semiconductor layer; forming a second insulating layer by deposition, and allowing the second insulating layer to cover the exposed semiconductor layer, source electrode and drain electrode; forming the auxiliary electrode on the second insulating layer by deposition, and allowing the auxiliary electrode to fill the accommodating space; and, forming the conductive connector at the exposed two ends of the drain electrode by deposition, and connecting the conductive connector to the drain electrode and the auxiliary electrode, respectively.

In one embodiment, after the forming an auxiliary electrode and a conductive connector on one side of the drain electrode away from the substrate, the manufacturing method further includes: forming a word line by a patterning process, and electrically connecting the word line to the gate electrode; and, forming a bit line by a patterning process, and electrically connecting the bit line to the source electrode.

In accordance with another embodiment of the present disclosure, a method for reading/writing the semiconductor memory device described above is provided, including steps of: in a writing state, applying a first voltage to the gate electrode through a word line to turn on the transistor, applying a data signal to the source electrode through a bit line, and storing the data signal into a storage capacitor connected to the drain electrode and the auxiliary electrode through the turned-on transistor; and in a reading state, applying a second voltage to the gate electrode through the word line, and measuring the current on the source electrode through the bit line to read the data signal.

The semiconductor memory device according to the embodiments of the present disclosure has the following beneficial technical effects.

In the semiconductor memory device provided by the present disclosure, one transistor is provided in each memory cell, a gate electrode and an auxiliary electrode are provided in the transistor, and the auxiliary electrode is electrically connected to a drain electrode. During a writing operation, a first voltage is applied to the gate electrode through the word line, and an electrical signal is then applied to the source electrode through the bit line according to the external input data. The source electrode transmits the electrical signal to the drain electrode, the drain electrode transmits to the electrical signal to the auxiliary electrode, and the node capacitor of the auxiliary electrode and the drain electrode is used as the storage capacitor of the memory cell, such that data writing is realized. During a reading operation, a second voltage is applied to the auxiliary electrode through the word line by using the influence of the voltage on the auxiliary electrode on the threshold voltage of the transistor (the size of the second voltage is between the threshold voltage of the transistor when storing "1" and the threshold voltage of the transistor when storing "0"), and data reading is realized by detecting the size of the output current of the transistor. Therefore, the reading/writing of the data can be realized by providing only one transistor in the memory cell, without providing additional transistors or capacitor devices, such that the structure of the memory cell is greatly simplified and it is advantageous to improve the integration and storage density of the semiconductor memory device.

BRIEF DESCRIPTION OF THE DRAWINGS

The above and/or additional aspects and advantageous of the present disclosure will become apparent and be more readily appreciated from the following description of embodiments with reference to the drawings, in which.

DETAILED DESCRIPTION

Figure 1:
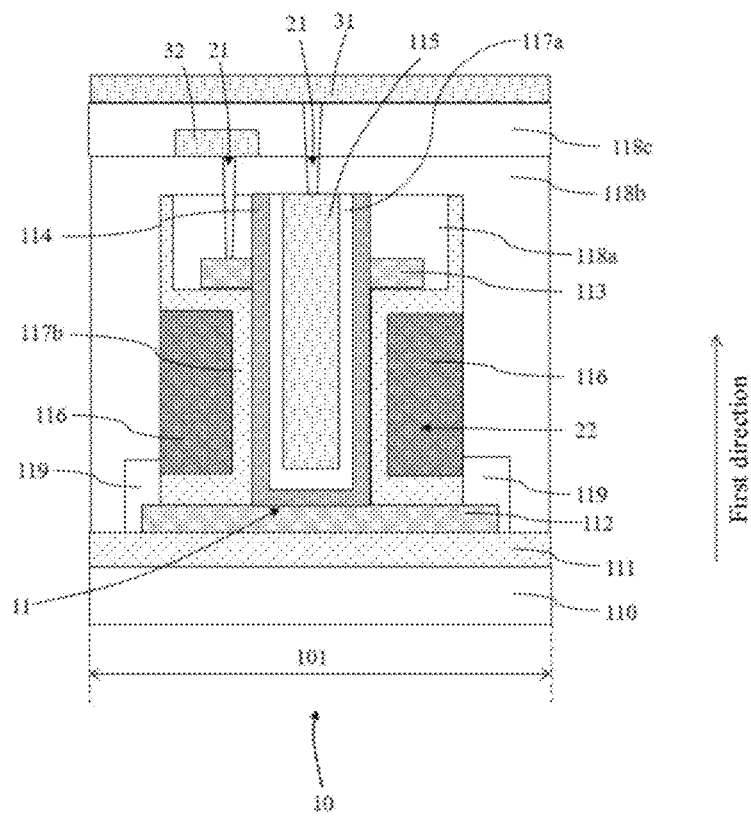
FIG. 1 is a schematic sectional view of a memory cell in a semiconductor memory device according to an embodiment of the present disclosure.

The present disclosure will be described in detail below, and the examples in the embodiments of the present disclosure are illustrated in the drawings throughout which the same or similar reference numerals refer to the same or similar components or components having the same or similar functions. In addition, if the detailed description of the well-known technologies is unnecessary for the illustrated features of the present disclosure, it will be omitted. The embodiments to be described below with reference to the drawings are exemplary, and are only used for explaining the present disclosure, rather than being construed as limiting the present disclosure.

It should be understood by those skilled in the art that singular forms "a", "an", and "the" as used herein may include plural forms as well, unless otherwise stated. It should be further understood that the term "comprise/comprising" used in this specification specifies the presence of the stated features, integers, steps, operations, elements and/or components, but does not exclude the presence or addition of one or more other features, integers, steps, operations, elements, components, and/or combinations thereof. It should be understood that, when an element is referred to as being "connected to" or "coupled to" another element, it can be directly connected or coupled to other elements or provided with intervening elements therebetween. In addition, the "connected" or "coupled" as used herein may include wireless connection or wireless coupling. As used herein, the wording "and/or" includes all or any of one or more associated listed items or combinations thereof.

The inventor(s) of the present disclosure consider(s) that the memory cell in the conventional DRAM semiconductor memory device usually includes a transistor and a capacitor, and the main operation principle is to store charge by a capacitor and then determine whether a binary bit is 1 or 0 by using the amount of charge stored in the capacitor. In the memory cell in a transistor/capacitor (1T/1C) configuration, the capacitor C is configured to store charge for representing the digit "1" and "0", and the transistor is configured to execute the writing operation and the reading operation. In the memory cell in a 1T/1C configuration, the leakage current may be large, such that the storage performance of the memory cell is affected. In addition, in order to improve the storage time of data and reduce the refresh rate, a capacitor with a larger capacitance value is usually needed, and the capacitance value of the capacitor is usually increased by increasing the area of the electrode of the capacitor. As a result, the area occupied by the memory cell on the substrate is increased, and the integration of the semiconductor memory device is reduced.

In order to improve the integration of the semiconductor memory device, a two-transistor/zero-capacitor mode (2T/0C) is adopted in the memory cell in the related art, that is, the gate electrode capacitor of one of the two transistors is used as a storage capacitor. However, for the semiconductor memory device adopting the 2T/0C mode, the structure of the memory cell is still not compact, and the integration and storage capacitor of the semiconductor memory device still need to be further improved.

The semiconductor memory device, the manufacturing method thereof and the reading/writing method thereof, and the storage device provided by the present disclosure are intended to reduce the leakage current while ensuring high integration.

In the present disclosure, an auxiliary electrode is additionally provided, the auxiliary electrode is electrically connected to the drain electrode and located on one side of the channel, an insulating layer is arranged between the auxiliary electrode and the channel, and a gate electrode is provided on the other side of the channel. The auxiliary electrode acts as both a back gate electrode and a storage electrode, and the function of storing charge can be realized while regulating the small off-state current of the transistor, such that refreshing at a relatively frequency can be realized without providing any additional capacitor. If an additional capacitor is provided, a higher charge storage capability can be ensured.

The semiconductor memory device, the manufacturing method thereof and the reading/writing method thereof, the electronic device and the memory circuit according to various embodiments of the inventive concept will be described in detail below with reference to the drawings.

Figure 2:
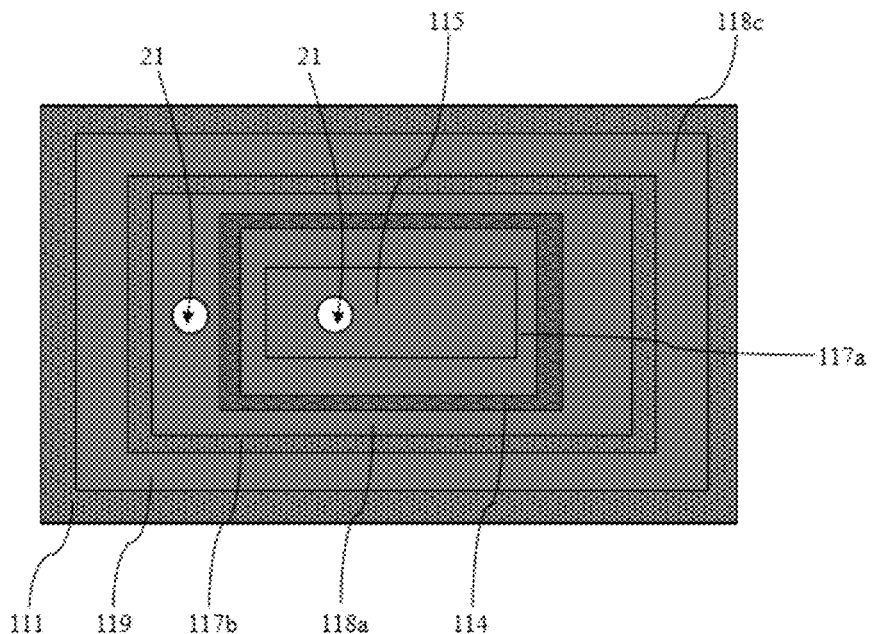
FIG. 2 is a schematic top view of the memory cell in the semiconductor memory device according to an embodiment of the present disclosure.
Figure 3:
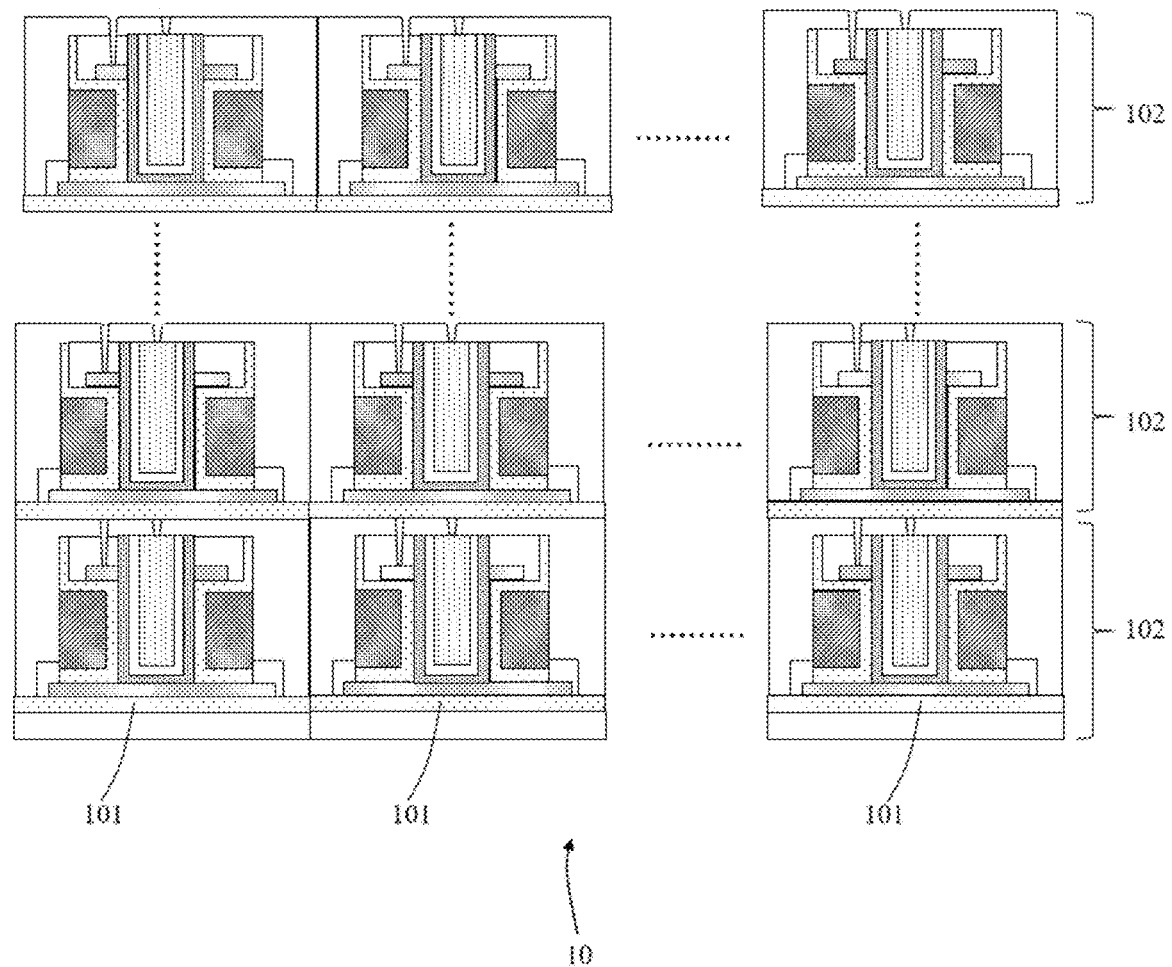
FIG. 3 is a schematic sectional view of the semiconductor memory device according to an embodiment of the present disclosure.

FIG. 1 is a schematic sectional view of a memory cell in a semiconductor memory device 10 according to an embodiment of the present disclosure. In FIG. 1, only one of a plurality of memory cells arranged in an array in the semiconductor memory device 10 is shown. FIG. 2 is a diagram showing orthographic projections of partial regions of some components in the memory cell shown in FIG. 1 on a plane.

As shown in FIG. 1, the semiconductor memory device 10 includes a substrate 110 and a plurality of memory cells 101 arranged on the substrate 110. Each of the memory cells 101 includes a transistor 11, a bit line 32 and a word line 31. The transistor 11 includes a drain electrode 112, a gate electrode 115, an auxiliary electrode 116, a semiconductor layer 114 and a source electrode 113.

The substrate 110 may be a silicon substrate, a glass substrate, a flexible substrate, etc., but it is not limited thereto. The substrate 110 may have an upper surface and a lower surface which are opposite to each other.

The gate electrode 115 may also be referred to as a first gate electrode, and the auxiliary electrode 116 may also be referred to as a second gate electrode. The gate electrode 115 refers to a gate electrode connected to the word line 31 to control the on/off of the transistor 11, while the auxiliary electrode 116 is relative to the gate electrode 115. The gate electrode 115 is located on the front side of the channel of the semiconductor layer, while the auxiliary electrode 116 is located on the rear side of the channel of the semiconductor layer. Both the gate electrode 115 and the auxiliary electrode 116 play a role of controlling the current of the transistor and have the function of the gate electrode. However, the auxiliary electrode 116 controls the transistor to reduce the loss of the leakage current instead of controlling the on or off of the transistor, while the gate electrode 115 controls the on or off of the transistor under the action of the voltage on the word line.

In some implementations, the gate electrode 115 may be arranged on the substrate 110, extends in a first direction perpendicular to the upper surface of the substrate 110, and is cylindrical. The gate electrode 115 is electrically connected to the word line 31.

An interlayer insulating layer 111 may be arranged on the upper surface of the substrate 110, and the drain electrode 112 may be arranged on the interlayer insulating layer 111.

The semiconductor layer 114 may be arranged on the interlayer insulating layer 111, and at least a portion of the semiconductor layer 114 may surround the sidewall of the gate electrode 115.

The semiconductor 114 may be formed from a monocrystalline semiconductor material, a polycrystalline semiconductor material or a metal oxide semiconductor. In addition, the metal oxide semiconductor may contain at least one of In, Ga, Zn, Sn and W.

The source electrode 113 may be arranged to surround the outer sidewall of the semiconductor layer 114, and may be electrically connected to the semiconductor layer 114. The source electrode 113 may be electrically connected to the word line 32.

The drain electrode 112 may be arranged in a lower portion of the semiconductor layer 114 to be electrically connected to the semiconductor layer 114. In addition, the drain electrode 112 is spaced apart from the source electrode 113 in the first direction.

The first insulating layer 117a may be arranged between the gate electrode 115 and the semiconductor layer 114 and arranged between the gate electrode 115 and the drain electrode 112.

The auxiliary electrode 116 may be arranged between the source electrode 113 and the drain electrode 112 in the first direction to surround the outer sidewall of the semiconductor layer 114.

A second insulating layer 117b may be arranged between the auxiliary electrode 116 and the semiconductor layer 114 and arranged between the auxiliary electrode 116 and the source electrode 113, such that the auxiliary electrode 116 is insulated from both the semiconductor layer 114 and the source electrode 113. In addition, the auxiliary electrode 116 may be electrically connected to the drain electrode 112.

Specifically, the auxiliary electrode 116 may extend from the source electrode 113 to the drain electrode in the first direction. In one embodiment, the auxiliary electrode 116 may be at least partially overlapped with the drain electrode 112 in the first direction. That is, the orthographic projection of the auxiliary electrode 116 on a plane parallel to the upper surface of the substrate 110 may be overlapped with the orthographic projection of the drain electrode 112 on the plane parallel to the upper surface of the substrate 110.

In one embodiment, the orthographic projection of the outer sidewall of the auxiliary electrode 116 on the plane parallel to the upper surface of the substrate 110 may be located outside the orthographic projection of the source electrode 113 on the plane, and may be located within the orthographic projection of the drain electrode 112 on the plane.

As shown in FIG. 1, the semiconductor layer 114 may surround the sidewall of the gate electrode 115 and the lower surface of the gate electrode 115 in a U-like shape, and the first insulating layer 117a may also be formed between the semiconductor layer 114 and the gate electrode 115 in a U-like shape to insulate the semiconductor layer 114 from the gate electrode 115.

As shown in FIG. 1, the drain electrode 112 may be arranged between the substrate 110 and the semiconductor layer 114, and may contact with the lower surface of the semiconductor layer 114.

It is shown in FIG. 1 that the drain electrode 112 is arranged between the substrate 110 and the semiconductor layer 114; however, unlike that shown in FIG. 1, the drain electrode 112 may alternatively be arranged to surround the lower portion of the outer sidewall of the semiconductor layer 114 and contact with the lower portion of the outer sidewall of the semiconductor layer 114.

Specifically, as shown in FIG. 1, the drain electrode 112 may include a first portion located between the substrate 110 and the semiconductor layer 114 and a second portion extending outward from the first portion in a second direction parallel to the upper surface of the substrate 110. In addition, the second portion of the drain electrode 112 may be at least partially overlapped with the auxiliary electrode 116.

In one embodiment, although it is not shown in the drawing, the second portion of the drain electrode 112 may directly contact with the auxiliary electrode 116.

In another embodiment, as shown in FIG. 1, the auxiliary electrode 116 may be spaced apart from the second portion of the drain electrode 112 in the first direction through the second insulating layer 117b, and the auxiliary electrode 116 may be electrically connected to the second portion of the drain electrode 112 through a conductive connector 119.

Specifically, the auxiliary electrode 116 may be electrically connected to the end of the second portion of the drain electrode 112 through the conductive connector 119.

Although it is not show in the drawing, the conductive connector 119 may surround the outer sidewall of the semiconductor layer 116 in a ring shape, and may extend downward in the first direction (e.g., extending through the second insulating layer 117b) to be connected to the second portion of the drain electrode 112. In addition, the orthographic projection of the conductive connector 119 on the plane parallel to the upper surface of the substrate 110 is located within the orthographic projection of the auxiliary electrode 116 on the plane.

In another embodiment, the conductive connector 119 may electrically connect a portion of the outer sidewall of the auxiliary electrode 116 to the end of the second portion of the drain electrode 112. In this case, as shown in FIG. 2, the orthographic projection of the conductive connector 119 on the plane parallel to the upper surface of the substrate 110 may be located outside the orthographic projection of the auxiliary electrode 116 on the plane.

The word line 31 and the bit line 32 are located above the gate electrode 115 and insulated from each other in different layers.

As shown in FIG. 1, the source electrode 113 may be at least partially overlapped with the auxiliary electrode 116 in the first direction. That is, the orthographic projection of the source electrode 113 on the plane parallel to the upper surface of the substrate 110 may be overlapped with the orthographic projection of the auxiliary electrode 116 on the plane.

In addition, the semiconductor memory device 10 may further include an additional electrode (not shown) which is at least partially overlapped with the auxiliary electrode 116 in the first direction. The additional electrode and the second electrode 116 may form two opposite electrodes of the capacitor.

As shown in FIG. 1, the orthographic projection of the gate electrode 115 on the plane parallel to the upper surface of the substrate 110 is overlapped with the orthographic projection of the drain electrode 112 on the plane parallel to the upper surface of the substrate 110, and the gate electrode 115 may be insulated from the drain electrode 112.

However, in other implementations, the orthographic projection of the gate electrode 115 on the substrate 110 is not overlapped with the orthographic projection of the drain electrode 112 on the substrate 110.

As shown in FIG. 1, the auxiliary electrode 116 may be arranged on the upper surface of the drain electrode 112 away from the substrate 110. The orthographic projection of the second electrode 116 on the substrate 110 may be overlapped with the orthographic projection of the drain electrode 112 on the substrate 110. The auxiliary electrode 116 may be insulated from the gate electrode 115. The orthographic projection of the second electrode 116 on the substrate 110 may be not overlapped with the orthographic projection of the drain electrode 115 on the substrate 110.

The semiconductor 114 may surround the gate electrode 115. As shown in FIG. 1, the orthographic projection of the semiconductor layer 114 on the substrate 110 is overlapped with the orthographic projection of the drain electrode 112 on the substrate 110, the semiconductor layer 114 is insulated from the gate electrode 115 and the auxiliary electrode 116, respectively, and the semiconductor layer 114 is electrically connected to the drain electrode 112.

The drain electrode 113 may be electrically connected to the semiconductor layer 114 and the bit line 32, respectively, and the source electrode 113 may be insulated from the gate electrode 115 and the auxiliary electrode 116.

Specifically, as shown in FIGS. 1-5, the substrate 110 may include silicon or glass, and the plurality of memory cells 101 on the substrate 110 are arranged in an array.

The drain electrode 112 may be formed by a patterning process. The semiconductor 114, the gate electrode 115, the first insulating layer 117a, the second insulating layer 117b, the auxiliary electrode 116 and the source electrode 113 are arranged on the upper surface of the drain electrode 112 away from the substrate 110.

The source electrode 113 may be located on the surface of the auxiliary electrode 116 away from the substrate 110, that is, the drain electrode 112, the auxiliary electrode 116 and the source electrode are sequentially stacked in the first direction in FIG. 1. The gate electrode 115 and the auxiliary electrode 116 extend on the substrate 110 in the first direction. That is, the length of the gate electrode 115 and the auxiliary electrode 116 in the first direction in FIG. 1 is greater than that in other directions.

The insulation of the gate electrode 115 from the semiconductor layer 114 and the insulation of the source electrode 113 from the drain electrode 112 are realized by the first insulating layer 117a, the insulation of the auxiliary electrode 116 from the semiconductor layer 114 and the insulation of the source electrode 113 from the drain electrode 112 are realized by the second insulating layer 117b, and the source electrode 113 and the drain electrode 112 are electrically connected to the semiconductor 114, respectively. The source electrode 113, the drain electrode 112, the gate electrode 15, the auxiliary electrode 116 and the semiconductor layer 114 are stacked to form a transistor 11 of a stereographic structure (the semiconductor layer 114, the gate electrode 115 and the auxiliary electrode 116 all extend in a direction perpendicular to the substrate 110), wherein the auxiliary electrode 116 is electrically connected to the drain electrode 112. The memory cell 101 further includes a word line 31 and a bit line 32, the word line 31 is electrically connected to the gate electrode 115, and the bit line 32 is electrically connected to the source electrode 113.

When the semiconductor memory device 10 is in a writing operation mode, a first voltage is applied to the gate electrode 115 through the word line 31. The first voltage is a turn-on voltage (e.g., +5 V). In this case, the channel of the transistor is in the on state, and the voltage on the source electrode is approximately equal to the voltage on the drain electrode. Meanwhile, a voltage input data signal is applied to the source electrode 113 through the bit line 32. The voltage on the drain electrode 112 is equal to the voltage of the data signal input by the source electrode. Since the drain electrode 112 is electrically connected to the auxiliary electrode 116, at this time, the size of the voltage on the source electrode 113 and the drain electrode 112 is equal to that of the voltage on the auxiliary electrode 116 (the drain electrode 112 and the auxiliary electrode 116 have the same potential). The node capacitor of the auxiliary electrode 116 with the drain electrode 112 forms the storage capacitor 103 of the memory cell 101, and the size of the voltage on the auxiliary electrode 116 determines the amount of charge in the storage capacitor and further determines whether the binary of the data signal stored in the memory cell 101 is 0 or 1. When a high voltage (e.g., 5 V) is applied to the source electrode 113 through the bit line 32, the data "1" is written into the memory cell 101; and, when a low voltage (e.g., 0 V) is applied to the source electrode 113 through the bit line 32, the data "0" is written into the memory cell 101.

In the above embodiment, the node capacitor may be a potential difference between the auxiliary electrode 116 and infinity, or a potential difference between the auxiliary electrode 116 and a surrounding electrode (e.g., the source electrode or the gate electrode).

When the semiconductor memory device 10 is in a reading operation mode, a second voltage is applied to the gate electrode 115 through the bit line 31, such that there is a voltage difference between the gate electrode 115 and the source electrode 113. The transistor is turned on, the charge stored in the auxiliary electrode 116, and the size of the current on the bit line 32 (i.e., the output current of the transistor) is detected. Thus, data reading is completed. In some implementations, the detected bit line 32 may be the above bit line. In this case, the signal input line and the data reading line are the same line.

Specifically, when the data previously stored in the memory cell 101 is "1", the auxiliary electrode 116 and the drain electrode 112 have a high potential (e.g., +5 V). Under the joint action of the first voltage o the gate electrode and the second voltage on the gate electrode, the transistor 11 is in the on state, so an obvious current can be measured through the bit line 32. When an obvious current is measured, the read data is determined as "1". When the data previously stored in the memory cell 101 is "0", the auxiliary electrode 116 and the drain electrode 112 have a low potential. After the second voltage is applied to the gate electrode 115, the transistor 11 is still in the off state, so the current measured by the bit line 32 is very weak. In this case, the read data is determined as "0".

It is to be noted that the size of the threshold voltage of the transistor 11 is related to the control of the auxiliary electrode 116. When there is only the gate electrode, Vth is related to the material, the device structure or other factors.

If there is an auxiliary electrode for regulating the semiconductor channel of the transistor, Vth of the transistor will be negatively biased.

Figure 6:
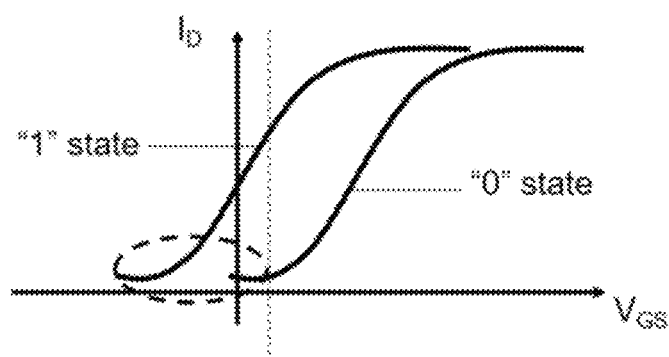
FIG. 6 is a graph of the transfer characteristic of the transistor in the semiconductor memory device when different data is written.

For an N-type field effect transistor (the carrier is electrons when the transistor is turned on), if the potential on the auxiliary electrode 116 and the drain electrode 112 is higher (e.g., +5 v), the turn-on voltage on the gate electrode of the transistor is lower (that is, the threshold voltage is negatively biased). That is, when the voltage difference between the gate electrode 115 and the source electrode 113 is small, the transistor 11 can still be turned on. If the potential on the auxiliary electrode 116 and the drain electrode 112 is lower, the control effect of the auxiliary electrode on the channel of the semiconductor layer is weaker, and the threshold voltage will not be affected by the auxiliary electrode. Therefore, when the same second voltage is applied to the gate electrode 115, with reference to FIG. 6, the horizontal axis in FIG. 6 represents the voltage (e.g., the second voltage) applied to the gate electrode 115, and the vertical axis represents the output current of the transistor 11. When the voltage applied to the gate electrode 115 is a specific value (the dashed line in FIG. 6), the size of the voltage on the auxiliary electrode 116 and the drain electrode 112 (i.e., whether the data written by the transistor is "1" or "0") will lead to a significant difference in the output current of the transistor 11 (i.e., the current measured by the bit line 32). The data can be read from the memory cell 101 by detecting the current on the bit line 32. When the data written by the transistor 11 is "1", the output current of the transistor 11 is higher, such that the read data is also "1". When the data written by the transistor 11 is "0", the output current of the transistor 11 is very weak, such that the read data is also "0".

At this time, by additionally providing the auxiliary electrode to control the semiconductor channel, a higher current can be obtained when the turn-on current of the transistor is low, and it is difficult to turn off the transistor when it is turned on. When the transistor is turned off, a very high voltage is required to turn on the transistor, and it is difficult to turn on the transistor. Thus, the dark current when the transistor is turned on or off is reduced, and the device's capability of storing and keeping charge is improved. In some embodiments, the refresh frequency can be reduced.

The numerical value of the second voltage may be determined according to the parameters of the transistor and the size of the voltage applied to the auxiliary electrode 116 and the drain electrode 112 during the writing operation. It is to be noted that the numerical value of the second voltage should be appropriate (it should be between the threshold voltage of the transistor when storing "1" and the threshold voltage of the transistor when storing "0"). If the numerical value of the second voltage is not appropriate, the size of the output current of the transistor 11 when storing the data "1" (that is, the potential on the drain electrode 112 and the auxiliary electrode 116 is high) will be very close to the size of the output current of the transistor when storing the data "0" (that is, the potential on the drain electrode 112 and the auxiliary electrode 116 is low). As a result, during the reading operation, it is difficult to determine whether the read data is "0" or "1", which will affect the performance of the semiconductor memory device 10. The most appropriate value of the second voltage may be determined by experiment or simulation, such that the difference in the output current of the transistor 11 during the reading operation in different states is maximized to improve the reading performance.

In the semiconductor memory device 10 provided by the present disclosure, one transistor is provided in each memory cell 101, a gate electrode 115 and an auxiliary electrode 116 are provided in the transistor 11, and the auxiliary electrode 116 is electrically connected to a drain electrode 112. During a writing operation, a first voltage is applied to the gate electrode 115 through the word line 31, and an electrical signal is applied to the source electrode 113 through the bit line 32 according to the external input data. The source electrode 113 transmits the electrical signal to the drain electrode 112, and the drain electrode 112 transmits the electrical signal to the auxiliary electrode 116. The node capacitor of the auxiliary electrode 116 with the drain electrode 112 forms the storage capacitor of the memory cell 101, such that data writing is realized (writing "1" or "0"). During a reading operation, a second voltage is applied to the auxiliary electrode 116 through the word line 31 by using the influence of the voltage on the auxiliary electrode 116 on the threshold voltage of the transistor 11 (the size of the second voltage is between the threshold voltage of the transistor 11 when storing "1" and the threshold voltage of the transistor 11 when storing "0", and data reading is realized by detecting the size of the output current of the field effect transistor. Therefore, compared with the structure in which the memory cell is provided with 2T1C or 2T0C in the related art, in the embodiments of the present disclosure, the reading/writing of the data can be realized by providing only one transistor 111 the memory cell 101 without providing additional transistors and capacitor devices, such that the structure of the memory cell 101 is greatly simplified and it is advantageous to improve the integration and storage density of the semiconductor memory device 10. In addition, it is easy to stack the memory cell 101 to form the semiconductor memory device 10 of the multilayer structure, and the process of forming the semiconductor memory device 10 is simplified.

In the embodiments of the present disclosure, the gate electrode 115, the auxiliary electrode 116, the semiconductor 114 and the source electrode 113 are all arranged on one side of the drain electrode 112 away from the substrate 110, and the specific positions of the gate electrode 15, the auxiliary electrode 116, the semiconductor layer 114 and the source electrode 113 may be adjusted according to the actual situation. In one embodiment, as shown in FIGS. 1 and 2, in the embodiments of the present disclosure, the orthographic projections of the gate electrode 115, the auxiliary electrode 116, the source electrode 113 and the semiconductor layer 114 on the substrate 110 are all within the orthographic projection of the drain electrode 112 on the substrate 110, such that the area occupied by the transistor 11 can be reduced, the structure layout of the semiconductor memory device 10 becomes more compact and it is more advantageous for the integration of the device.

As shown in FIGS. 1 and 2, in one embodiment, the auxiliary electrode 116 surrounds the gate electrode 115, and the semiconductor layer 114 is arranged between the gate electrode 115 and the auxiliary electrode 116. By allowing the auxiliary electrode 116 to surround the gate electrode 115, the area of the overlap regions of the gate electrode 115, the auxiliary electrode 116 and the semiconductor layer 114 can be increased to the greatest extent, and the influence of the auxiliary electrode 116 on the threshold voltage of the transistor 11 can thus be improved. That is, when the voltage on the auxiliary electrode 116 is different, a greater difference in the output current of the transistor can be caused by applying the same threshold voltage. Therefore, it is advantageous to distinguish the read data during the reading operation, and the accuracy of the read data is improved. It is to be noted that, the thickness of the layer of the gate electrode 115 and the layer of the auxiliary electrode 116 in the first direction in FIG. 1 may be determined according to the actual situation, and will not be limited herein.

In one embodiment, the material of the semiconductor layer 114 in the embodiments of the present disclosure includes a metal oxide semiconductor material. Due to the inherent characteristics (low electron mobility and other factors) of the metal oxide semiconductor, when the material of the semiconductor layer 114 is metal oxide, the leakage current of the transistor 11 can be reduced, and the speed of charge loss on the storage capacitor can be reduced. Thus, the data storage time of the semiconductor memory device 10 can be prolonged, and it is advantageous to reduce the refresh frequency and power consumption of the semiconductor memory device 10.

The material of the metal oxide may be indium gallium zinc oxide (IGZO). When the material of the metal oxide is IGZO, the leakage current of the transistor 11 is low (the leakage current is lower than or equal to $10^{-15}$ A), such that a low refresh rate of the semiconductor memory device is ensured. It is to be noted that, the material of the metal oxide may also be ITO, IWO, $ZnO_x$, $InO_x$, $In_2O_3$, InWO, $SnO_2$, $TiO_x$, $InSnO_x$, $ZnxO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_a$, $SixIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, etc., as long as the leakage current of the transistor can satisfy the requirements. The specific material may be adjusted according to the actual situation.

It is to be noted that the specific way of realizing the electrical connection between the auxiliary electrode 116 and the drain electrode 112 may be determined according to the actual situation. In one embodiment, as shown in FIGS. 1 and 2, the transistor 11 further includes a conductive connector 119. The conductive connector 119 is arranged on one side of the drain electrode 112 away from the substrate 110, and the auxiliary electrode 116 is electrically connected to the drain electrode 112 through the conductive connector 119. In the process of forming the semiconductor memory device 10, after the drain electrode 112 and the auxiliary electrode 116 are formed, the conductive connector 119 may be formed by depositing a metal material on the drain electrode 112, such that the process becomes easier. The material of the conductive connector 119 may be copper, aluminum or other materials with good conductivity, and will not be limited here. The size and position of the conductive connector 119 may be adjusted according to the actual situation. In one embodiment, as shown in FIGS. 1 and 2, the conductive connector 119 surrounds the auxiliary electrode 116, such that the contact area of the conductive connector 119 with the auxiliary electrode 116 and the drain electrode 112 can be increased to the greatest extent, and it is advantageous for the electrical connection performance of the auxiliary electrode 116 and the drain electrode 112.

In one embodiment, as shown in FIGS. 1 to 5, the semiconductor memory device 10 in the embodiments of the present disclosure includes a plurality of stacked array modules 102, and each array module 102 includes a plurality of memory cells 101 arranged in an array. Specifically, the word lines 31 (not shown in FIG. 3) of the plurality of memory cells 101 are connected to each other and the bit lines 32 (not shown in FIG. 3) are connected to each other, such that an array module 102 is formed. A plurality of array modules 102 are stacked to form a semiconductor memory device 10 of a stereoscopic structure, such that the area occupied by the semiconductor memory device 10 can be reduced while improving the storage capacity of the semiconductor memory device 10, and it is advantageous for the integration of the device.

Figure 4:
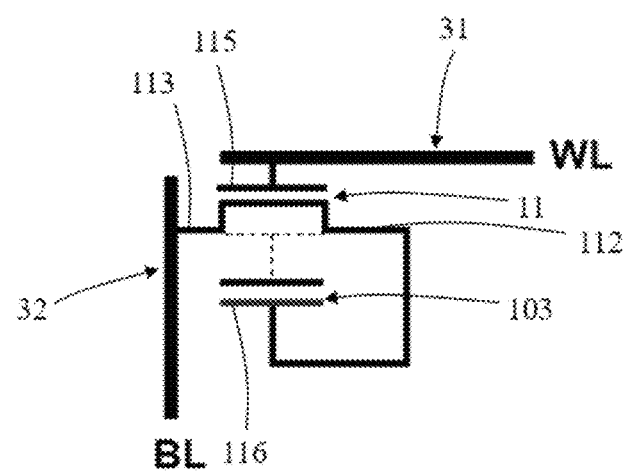
FIG. 4 is a schematic structure diagram of a memory circuit according to an embodiment of the present disclosure.
Figure 5:
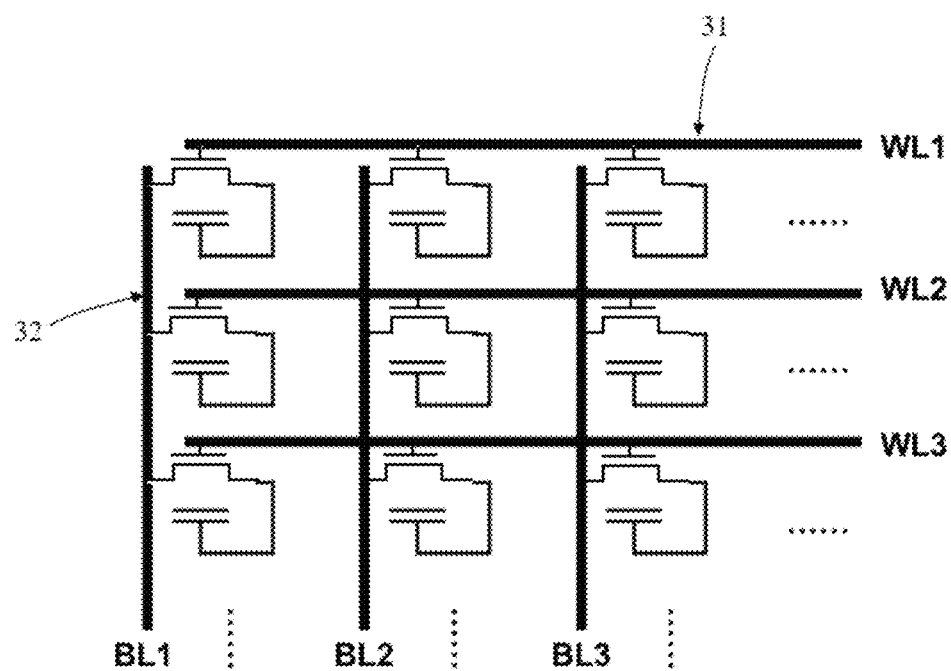
FIG. 5 is a schematic circuit diagram of the semiconductor memory device according to an embodiment of the present disclosure.

Based on the same inventive concept, an embodiment of the present disclosure further provides a memory circuit, as shown in FIG. 4, including a gate electrode 115, an auxiliary electrode 116, a source electrode 113, a drain electrode 112, a word line 31 and a bit line 32. The gate electrode 115 is electrically connected to the word line 31, the source electrode 113 is electrically connected to the bit line 32, and the drain electrode 112 is electrically connected to the auxiliary electrode 116. The gate electrode 115 is insulated from the auxiliary electrode 116, the gate electrode 115 is insulated from the source electrode 113 and the drain electrode 112, respectively, and the auxiliary electrode 115 is insulated from the source electrode 113 and the drain electrode 112, respectively. A node capacitor of the auxiliary electrode 116 with the drain electrode 112 forms a storage capacitor 103.

Based on the same inventive concept, an embodiment of the present disclosure further provides an electronic device, including the semiconductor memory device 10 according the embodiments of the present disclosure, or including the memory circuit according to the embodiments of the present disclosure. Since the electronic device includes the semiconductor memory device 10 according to the embodiments of the present disclosure, the electronic device have the same beneficial effects as the semiconductor memory device 10, which will not be repeated herein.

Specifically, the electronic device in this embodiment of the present disclosure may include a storage device, a smart phone, a computer, a tablet computer, an artificial intelligence device, a wearable device, a mobile power source electrode, etc., and may be specifically determined according to the actual situation. The storage device may include an internal memory in a computer, and will not be limited here.

Figure 7:
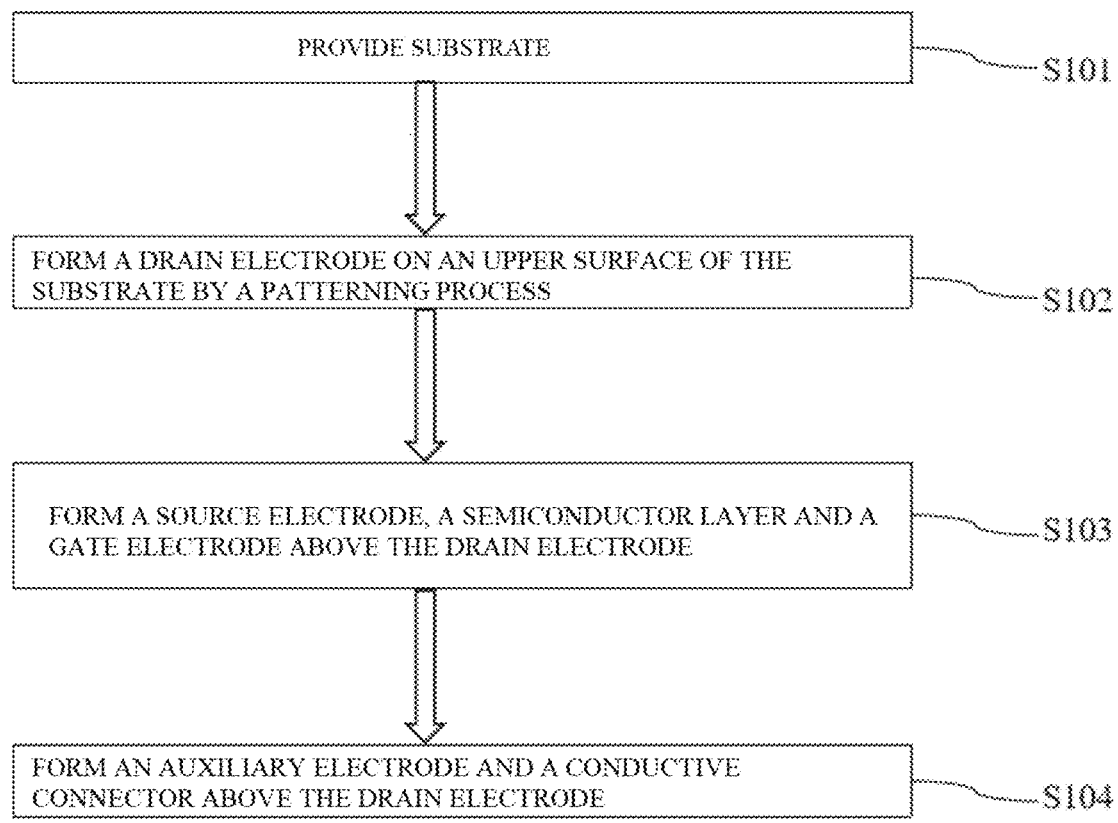
FIG. 7 is a flowchart of a method for manufacturing a semiconductor memory device according to an embodiment of the present disclosure.

Based on the same inventive concept, an embodiment of the present disclosure further provides a method for manufacturing a semiconductor memory device 10, as shown in FIG. 7, including the following steps.

In S101, a substrate is provided.

In S102, a drain electrode is formed on one side of the substrate by a patterning process.

In S103, a source electrode, a semiconductor layer and a gate electrode are formed in sequence on one side of the drain electrode away from the substrate.

In S104, an auxiliary electrode and a conductive connector are formed on one side of the drain electrode away from the substrate.

In the forming method according to this embodiment of the present disclosure, one transistor is provided in each memory cell 101, a gate electrode 115 and an auxiliary electrode 116 are provided in the transistor 11, and the auxiliary electrode 116 is electrically connected to a drain electrode 112. During a writing operation, a first voltage is applied to the gate electrode 115 through the word line 31, and an electrical signal is then applied to the source electrode 113 through the bit line 32 according to the external input data. The source electrode 113 transmits the electrical signal to the drain electrode 112, the drain electrode 112 transmits to the electrical signal to the auxiliary electrode 116, and the node capacitor of the auxiliary electrode 116 with the drain electrode 112 is used as the storage capacitor of the memory cell 101, such that data writing is realized. During a reading operation, a second voltage is applied to the auxiliary electrode 116 through the word line 31 (the size of the second voltage is between the threshold voltage of the transistor 11 when storing "1" and the threshold voltage of the transistor 11 when storing "0"), and data reading is realized by detecting the size of the output current of the field effect transistor. Therefore, the reading/writing of the data can be realized by providing only one transistor 11 in the memory cell 101, without providing additional transistors 11 or capacitor devices, such that the structure of the memory cell 101 is greatly simplified and it is advantageous to improve the integration and storage density of the semiconductor memory device 10.

In one embodiment, the forming a source electrode 113, a semiconductor layer 114 and a gate electrode 115 in sequence on one side of the drain electrode 112 away from the substrate 110 includes:

forming a sacrificial layer on one side of the drain electrode away from the substrate, the sacrificial layer covering the drain electrode;

forming a source electrode on one side of the sacrificial layer away from the substrate by a patterning process, an orthographic projection of the source electrode on the substrate being located within an orthographic projection of the drain electrode on the substrate;

forming a first dielectric layer on one side of the source electrode away from the substrate, the first dielectric layer covering the source electrode and the drain electrode;

forming a through hole in sequence penetrating through the first dielectric layer, the source electrode and the sacrificial layer, the bottom of the through hole exposing the drain electrode, the hole wall of the through hole exposing the source electrode; and forming a semiconductor layer, a first insulating layer and a gate electrode in the through hole in sequence, the semiconductor layer being electrically connected to the source electrode and the drain electrode, respectively.

In one embodiment, the forming an auxiliary electrode 116 and a conductive connector 119 on one side of the drain electrode 112 away from the substrate 110 includes:

removing the first dielectric layer and a portion of the sacrificial layer by a patterning process, such that two ends of the drain electrode are exposed;

removing the remaining sacrificial layer to form an accommodating space so as to expose the drain electrode, the source electrode and the semiconductor layer;

forming a second insulating layer by deposition, and allowing the second insulating layer to cover the exposed semiconductor layer, source electrode 113 and drain electrode;

forming the auxiliary electrode on the second insulating layer by deposition, and allowing the auxiliary electrode to fill the accommodating space; and forming the conductive connector at the exposed two ends of the drain electrode by deposition, and connecting the conductive connector to the drain electrode and the auxiliary electrode, respectively.

In one embodiment of the present disclosure, after the forming an auxiliary electrode 116 and a conductive connector 119 on one side of the drain electrode 112 away from the substrate 110, the manufacturing method further includes:

forming a word line by a patterning process, and electrically connecting the word line to the gate electrode; and forming a bit line by a patterning process, and electrically connecting the bit line to the source electrode.

The process of manufacturing a semiconductor memory device 10 in the embodiments of the present disclosure will be described in detail below with reference to the drawings. Specifically, the pattering process in the embodiments of the present disclosure includes photoresist coating, exposure, developing, etching and part or all of the process of removing the photoresist.

Figure 8A:
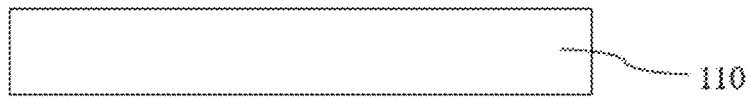
FIGS. 8a-8s are schematic structure diagrams of different processes of manufacturing the semiconductor memory device according to an embodiment of the present disclosure.

As shown in FIG. 8a, a substrate 110 is provided first. The material of the substrate 110 includes silicon or glass.

Figure 8B:
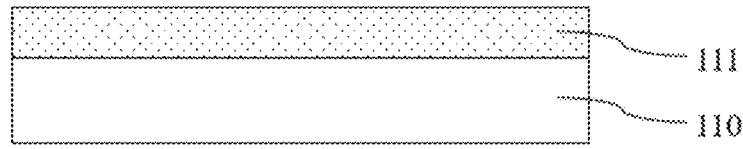

Then, as shown in FIG. 8b, an interlayer insulating layer 111 is formed on one side of the substrate 110.

Figure 8C:
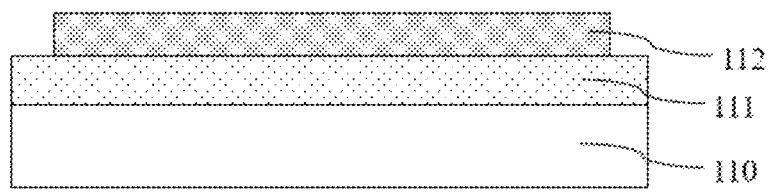

Then, as shown in FIG. 8c, a drain electrode 112 is formed on one side of the interlayer insulating layer 111 away from the substrate 10 by a patterning process.

Figure 8D:
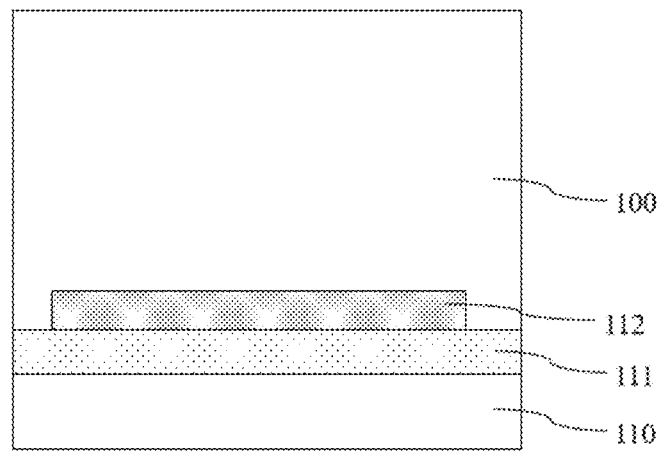

Then, as shown in FIG. 8d, a sacrificial layer 100 is formed on one side of the drain electrode 112 away from the substrate 110, and the sacrificial layer 100 covers the drain electrode 112. The material of the sacrificial layer 100 includes an organic material or an inorganic material.

Figure 8E:
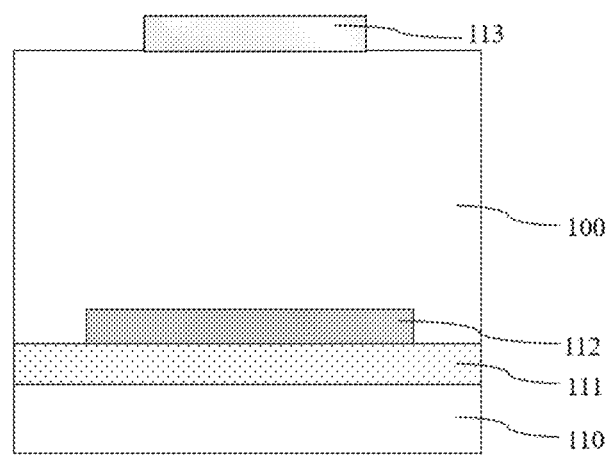

Then, as shown in FIG. 8e, a source electrode 113 is formed on one side of the sacrificial layer 100 away from the substrate 110 by a patterning process, and an orthographic projection of the source electrode 113 on the substrate 110 is located within an orthographic projection of the drain electrode 112 on the substrate 110.

Figure 8F:
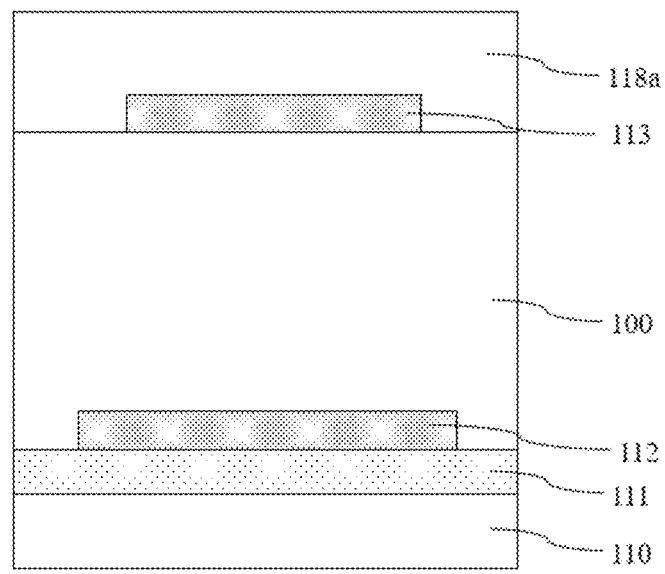

Then, as shown in FIG. 8f, a first dielectric layer 118a is formed on one side of the source electrode 113 away from the substrate 110, and the first dielectric layer 118a covers the source electrode 113 and the drain electrode 112. The material of the first dielectric layer 118a includes silicon oxide, silicon nitride or other inorganic materials.

Figure 8G:
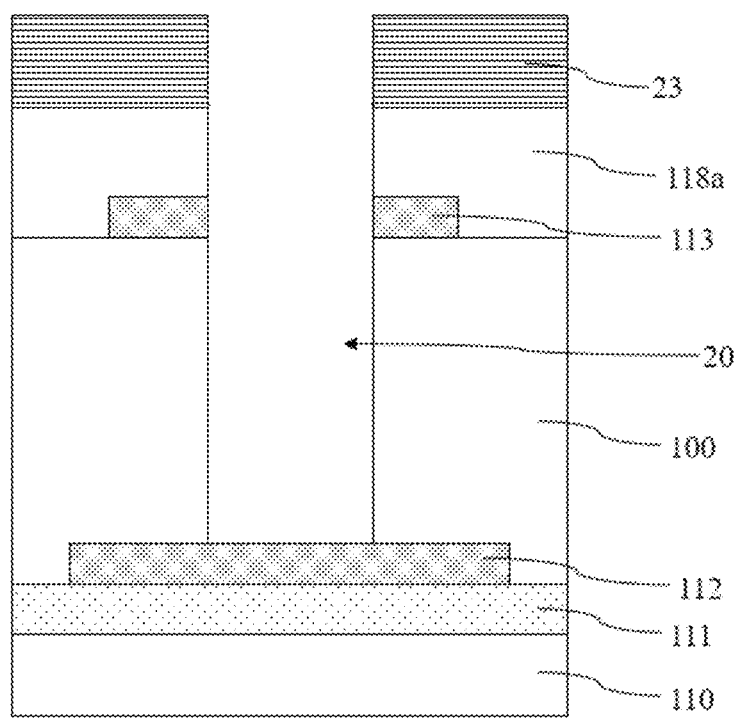

Then, as shown in FIG. 8g, a partial region on the first dielectric layer 118a is covered with a mask 23, a through hole 20 is formed on the first dielectric layer 118 not covered with the mask 23, and the through hole 20 penetrates through the first dielectric layer 118a, the source electrode 113 and the sacrificial layer 100 in sequence. The bottom of the through hole exposes the drain electrode 112, and the hole wall of the through hole 20 exposes the source electrode 113.

Figure 8H:
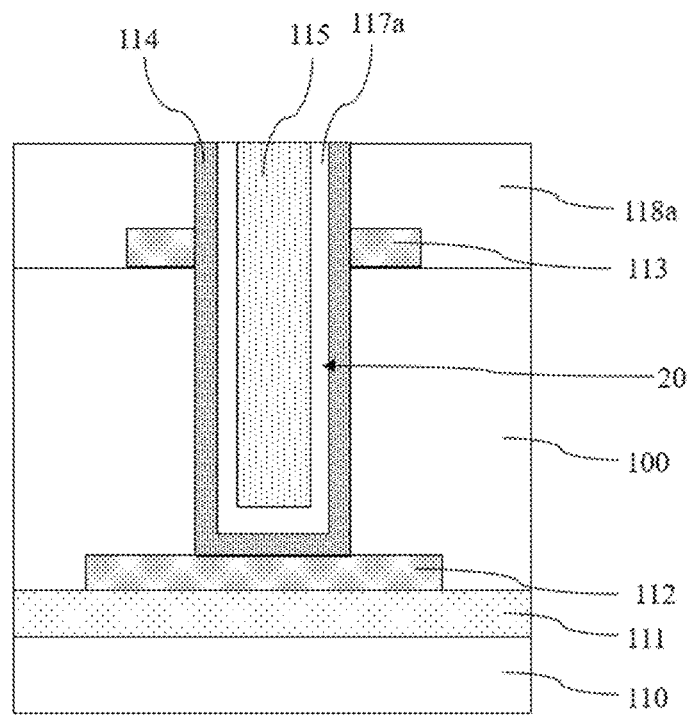

Then, as shown in FIG. 8h, a semiconductor layer 114, a first insulating layer 117a and a gate electrode 115 are formed in sequence in the through hole 20 by atomic deposition, chemical vapor deposition, physical vapor deposition or other processes, and the semiconductor layer 114 is electrically connected to the source electrode 113 and the drain electrode 112, respectively. The material of the semiconductor layer 114 includes IGZO or other metal oxides, and the material of the first insulating layer 117a includes aluminum oxide or other materials with good insulating performance. The material of the gate electrode 115 includes titanium nitride, tungsten or other materials with good conductivity. Then, the surfaces of the semiconductor layer 114, the first insulating layer 117a and the gate electrode 115 away from the substrate 110 are grinded by a chemical mechanical grinding process, such that the semiconductor layer 114, the first insulating layer 117a and the gate electrode 115 are flush with the first dielectric layer 118a.

Figure 8I:
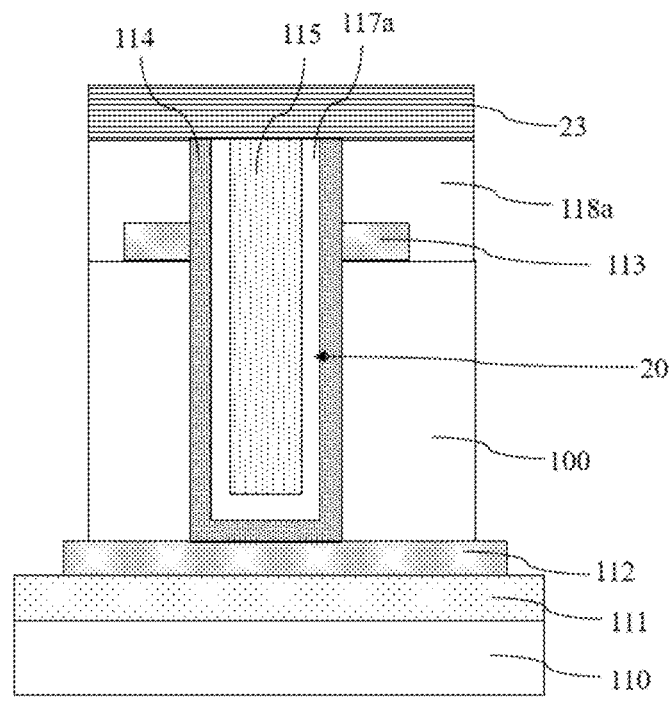

Then, as shown in FIG. 8i, the first dielectric layer 118a and a portion of the sacrificial layer 100 are removed by a patterning process, such that two ends of the drain electrode 112 are exposed. Specifically, the corresponding regions of the semiconductor layer 114, the first insulating layer 117a and the gate electrode 115 are covered with a mask 23, and portions of the first dielectric layer 118a and the sacrificial layer 100 at two ends are etched.

Figure 8J:
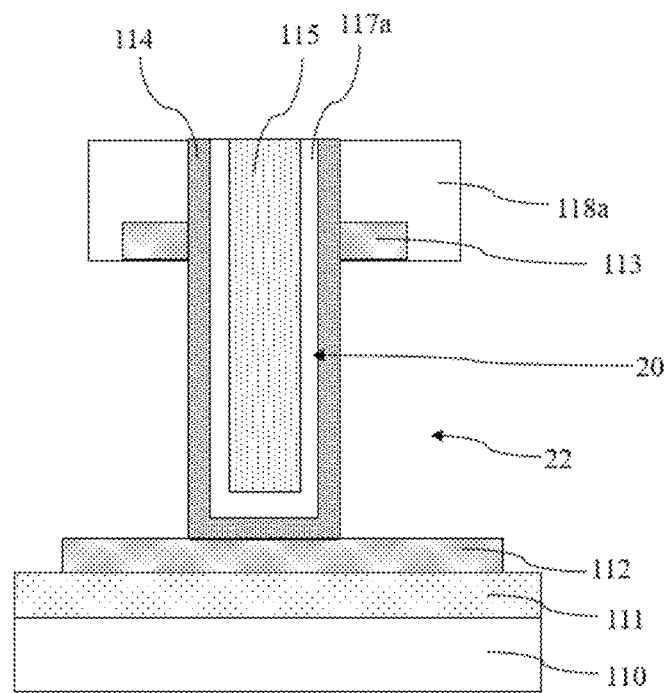

Then, as shown in FIG. 8j, the remaining sacrificial layer 100 is removed by an etching process to form an accommodating space 22 to expose the drain electrode 112, the source electrode 113 and the semiconductor layer 114.

Figure 8K:
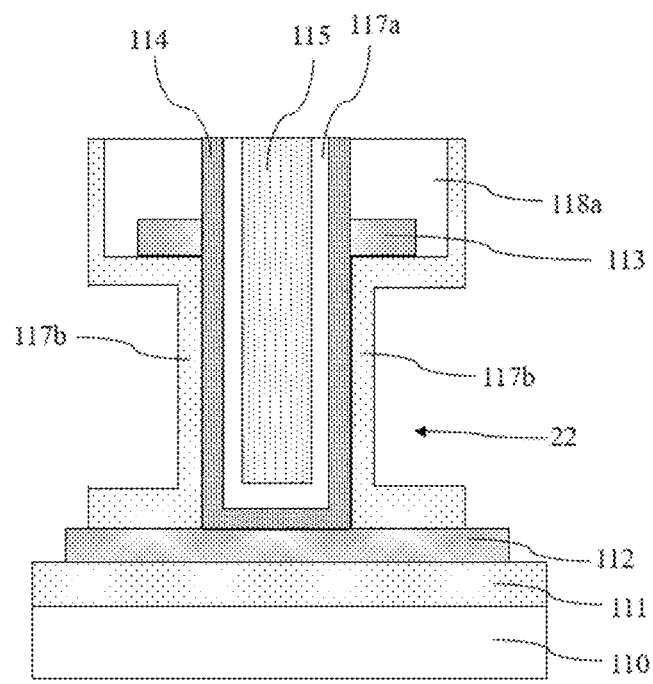

Then, as shown in FIG. 8k, a second insulating layer 117b is formed in the accommodating space 112 by a deposition process, and the second insulating layer 117b covers the exposed semiconductor layer 114, source electrode 113 and drain electrode 112.

Figure 8L:
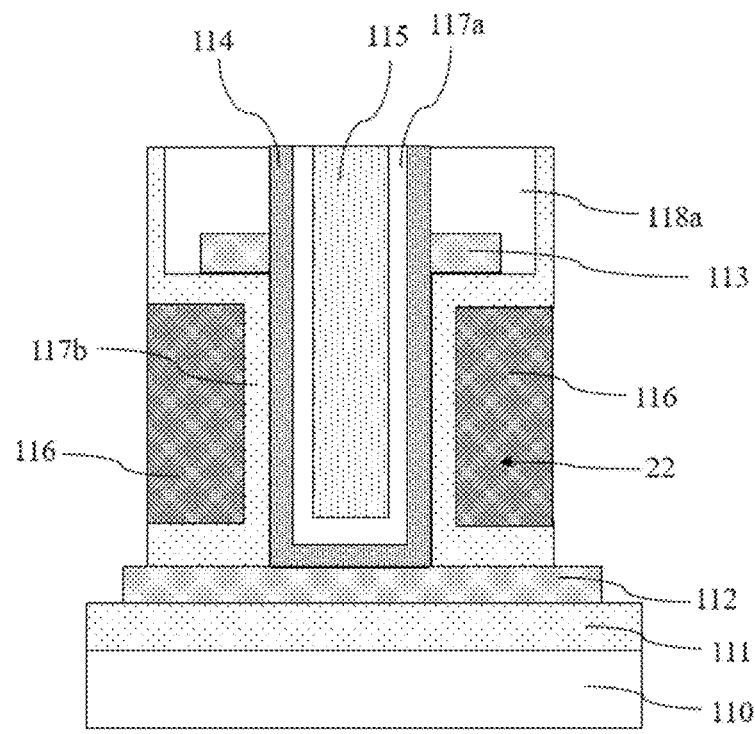

Then, as shown in FIG. 8l, an auxiliary electrode 116 is formed on the surface of the second insulating layer 117b by deposition, and the auxiliary electrode 116 fills the accommodating space 22. Then, the side face of the auxiliary electrode 116 is etched by an etching process to ensure that the auxiliary electrodes 116 of adjacent memory cells are insulated from each other.

Figure 8M:
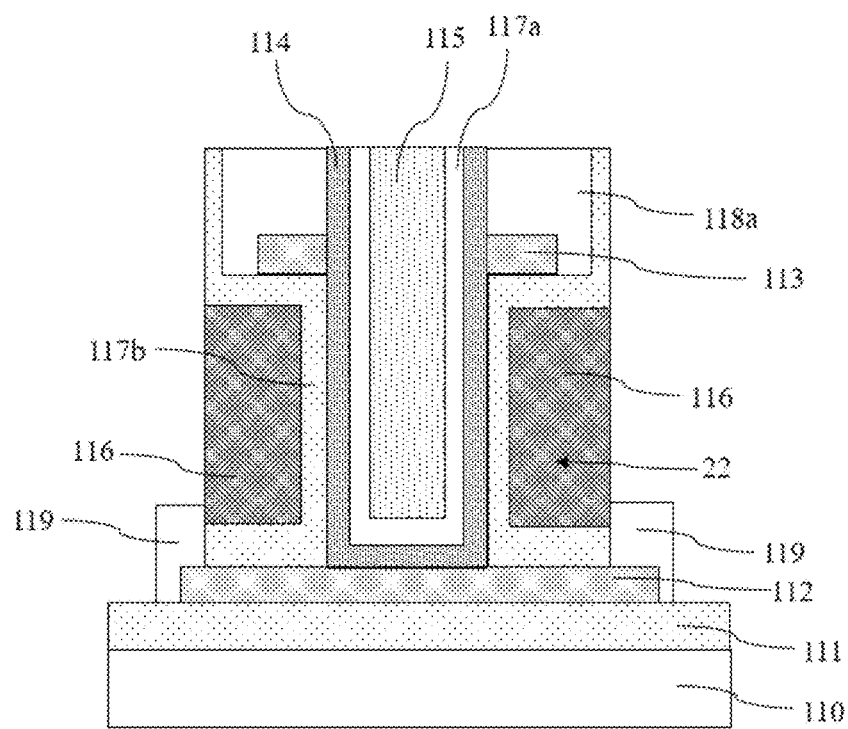

Then, as shown in FIG. 8m, a conductive connector 119 is formed at the exposed two ends of the drain electrode 112 by a deposition process, and the conductive connector 119 is connected to the drain electrode 112 and the auxiliary electrode 116, respectively, such that the transistor 11 is manufactured.

Figure 8N:
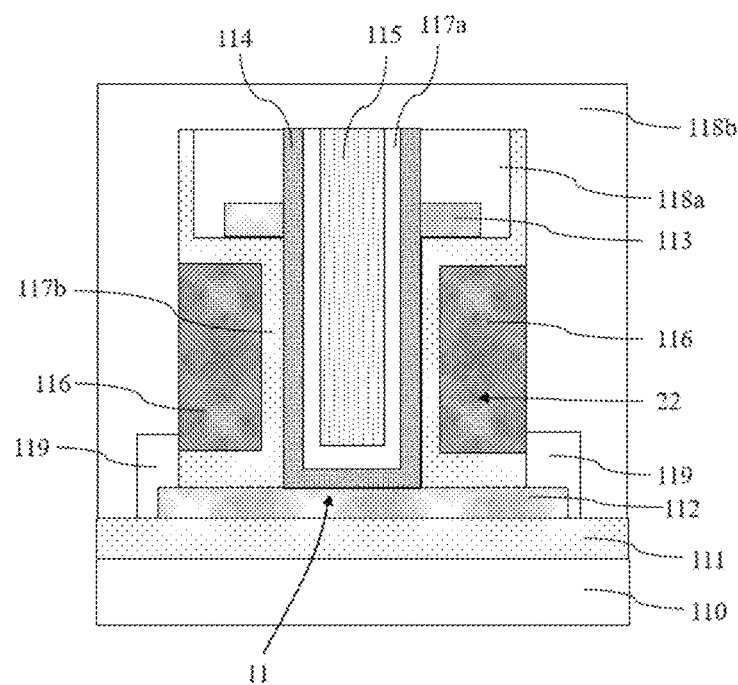

Then, as shown in FIG. 8n, a second dielectric layer 118b is formed on one side of the substrate 110 by a deposition process, and the second dielectric layer 118b covers the transistor 11.

Figure 8O:
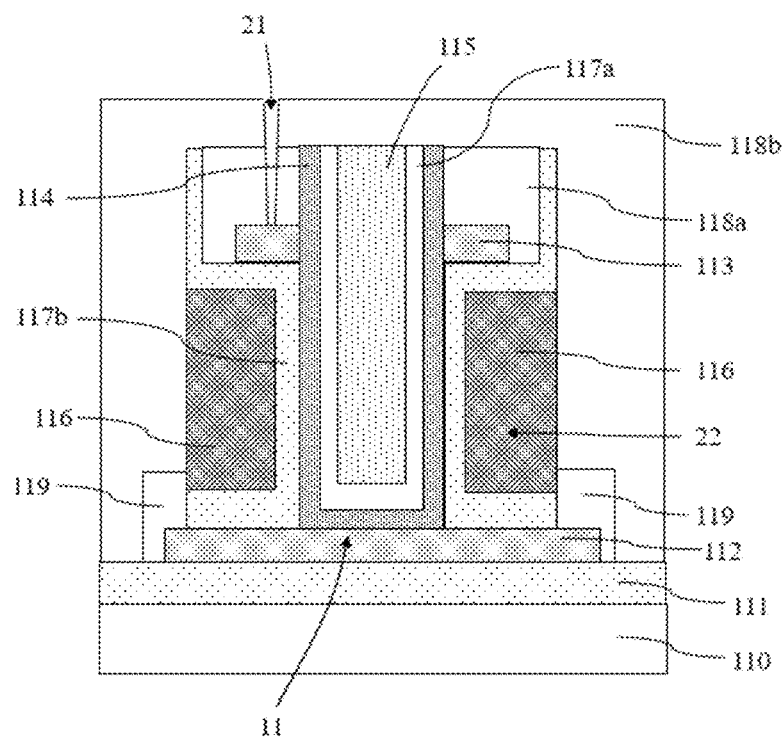

Then, as shown in FIG. 8o, a through passage 21 is formed at a position on the second dielectric layer 118b corresponding to the source electrode 113.

Figure 8P:
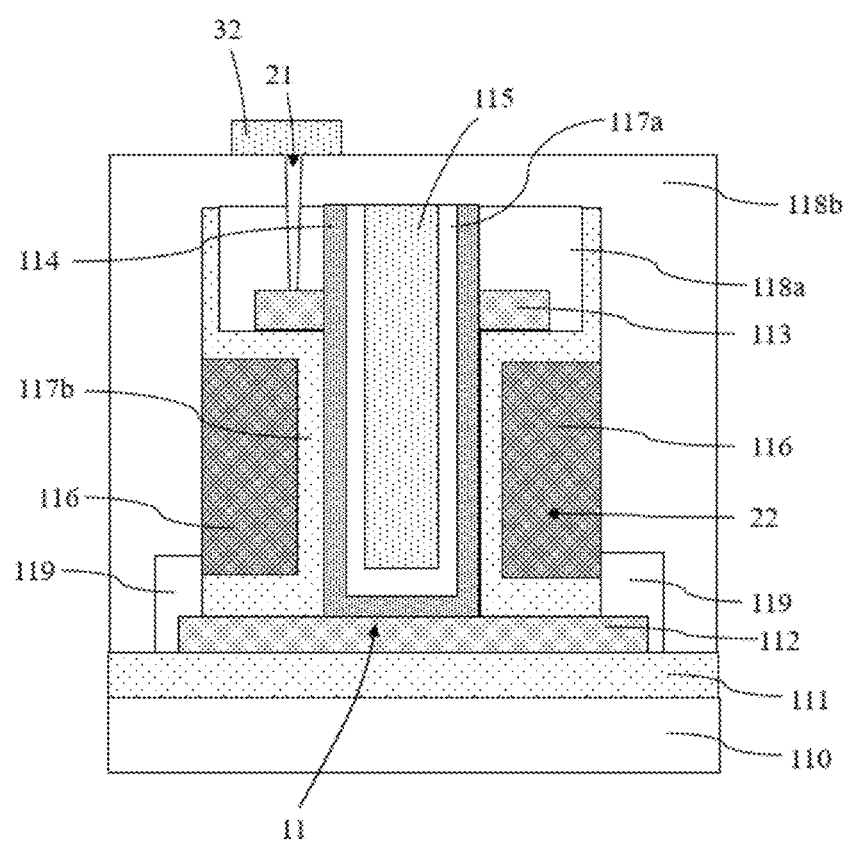

Then, as shown in FIG. 8p, a bit line 32 is formed on one side of the second dielectric layer 118b away from the substrate 110 by a patterning process, and the bit line 32 penetrates through the through path 21 to be electrically connected to the source electrode 113.

Figure 8Q:
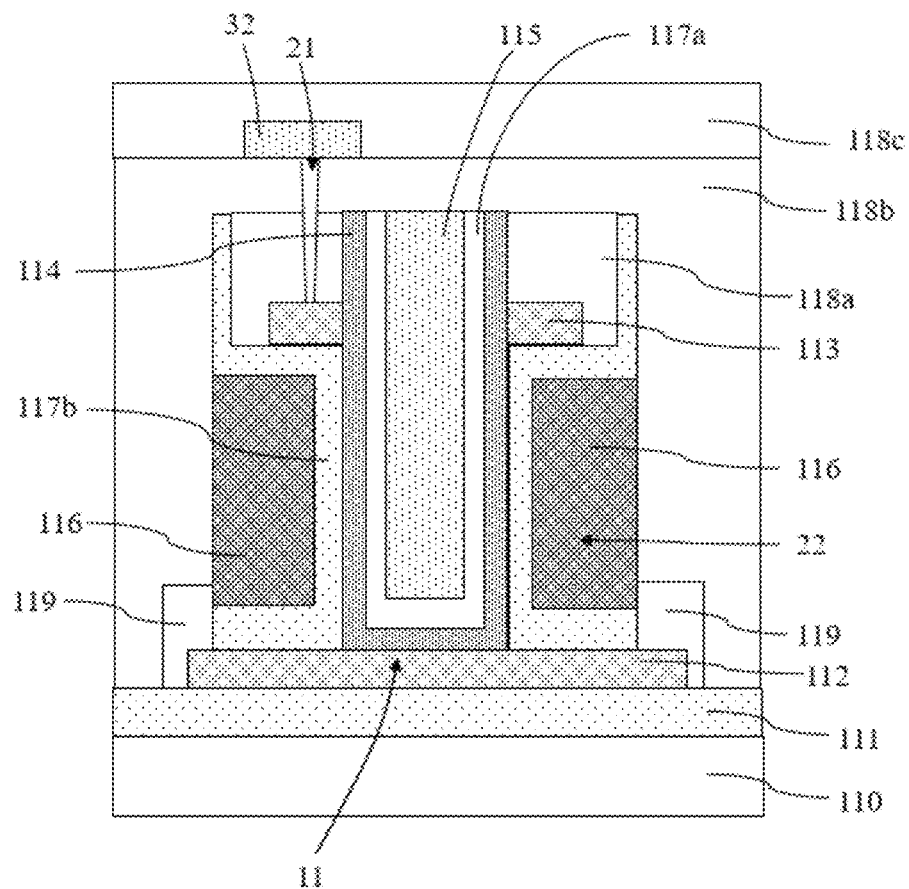

Then, as shown in FIG. 8q, a third dielectric layer 118c is deposited on the second dielectric layer 118b.

Figure 8R:
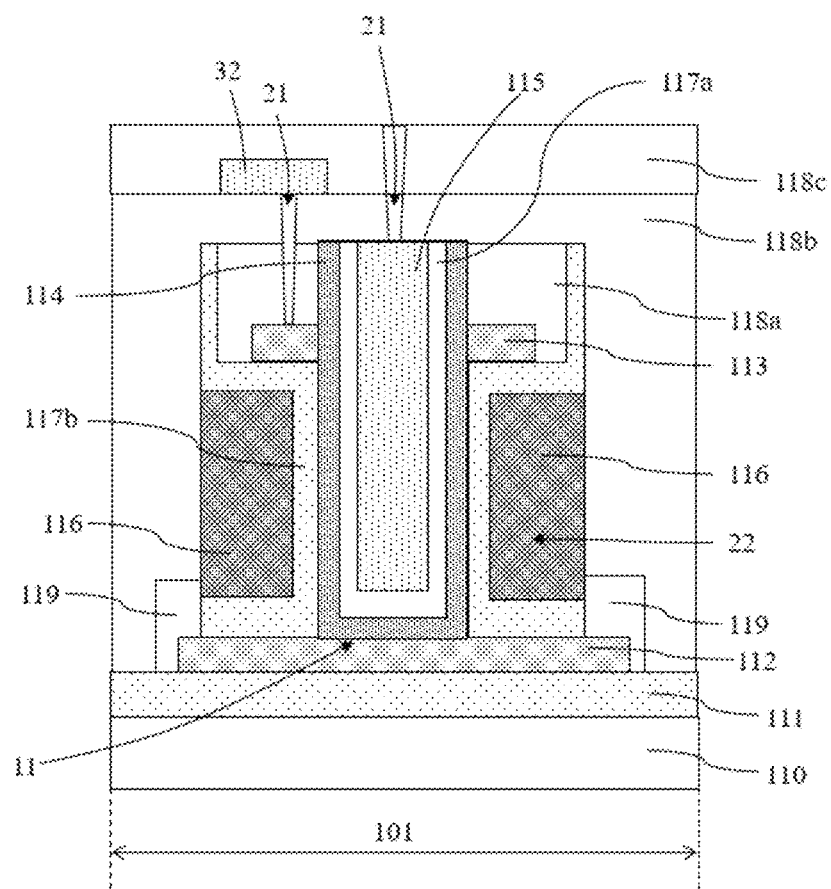

Then, as shown in FIG. 8r, a through passage 21 is formed at a position on the third dielectric layer 118c corresponding to the gate electrode 115.

Figure 8S:
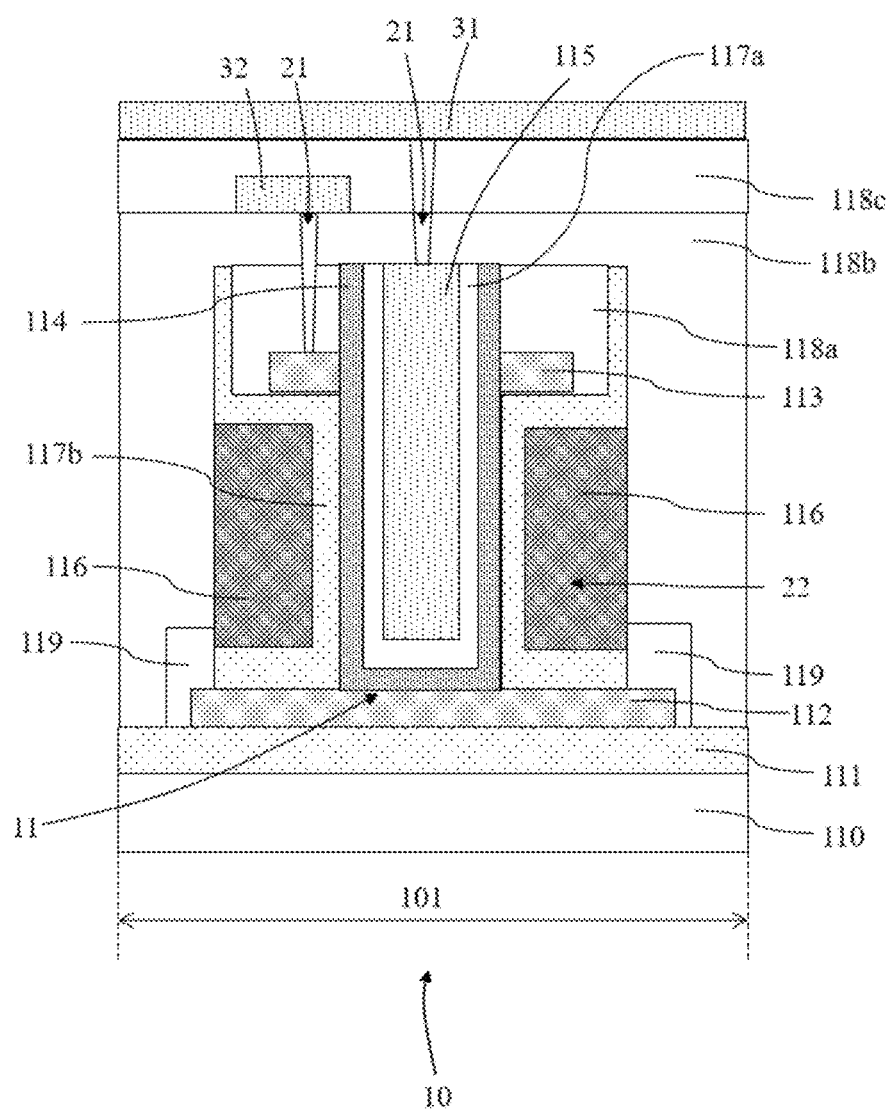

Then, as shown in FIG. 8s, a bit line 31 is formed on one side of the third dielectric layer 118c away from the substrate 110 by a patterning process, and the bit line 31 penetrates through the through path 21 to be electrically connected to the drain electrode 115.

Figure 9:
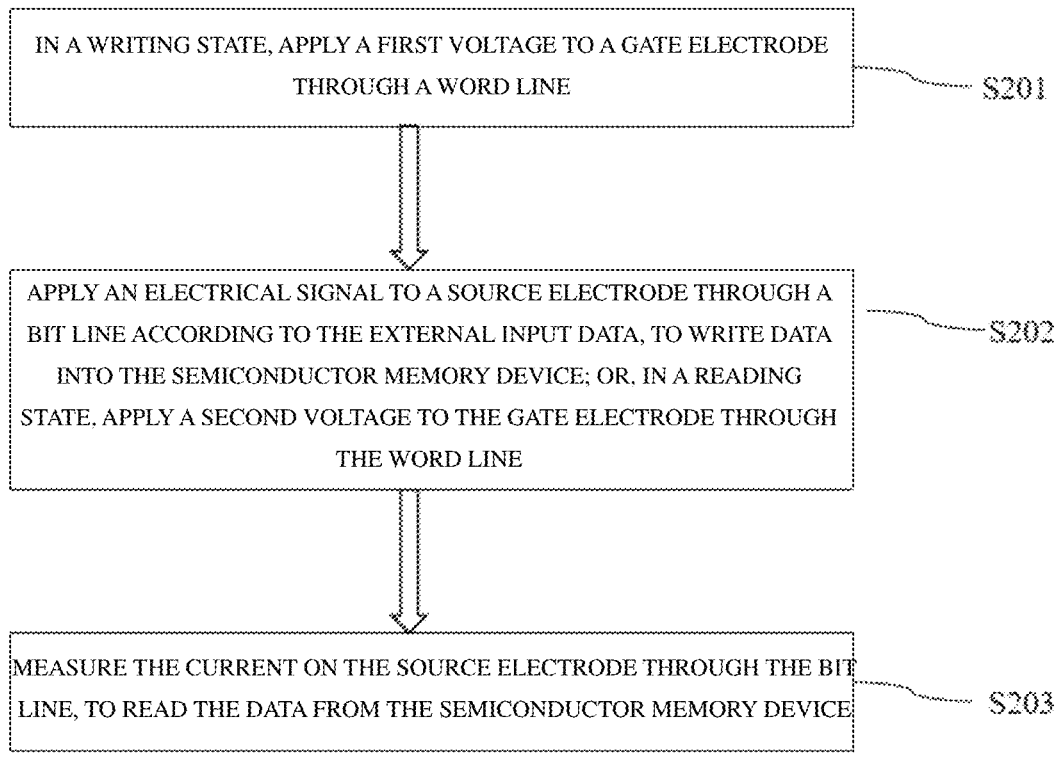
FIG. 9 is a flowchart of a method for reading/writing a semiconductor memory device according to an embodiment of the present disclosure.

Based on the same inventive concept, an embodiment of the present disclosure further provides a method for reading/writing a semiconductor memory device 10, as shown in FIG. 9, including the following steps.

In S201, in a writing state, a first voltage is applied to a gate electrode through a word line.

In S202, an electrical signal is applied to a source electrode through a bit line according to the external input data, such that data is written into a semiconductor memory device; or, in a reading state, a second voltage is applied to the gate electrode through the word line.

In S203, the current on the source electrode is measured by the bit line, such that the data is read out from the semiconductor memory device.

Specifically, as shown in FIGS. 1 and 2 (the word line and the bit line are not shown in FIG. 2), when the semiconductor memory device 10 is in a wiring operation mode, a first voltage (e.g., 5 V) is applied to the gate electrode 115 through the word line 31, such that the transistor 11 is in the on state. The size of the first voltage is related to the structure of the transistor 11, the material of the semiconductor layer 114 in the transistor 11 or other factors, and may be specifically adjusted according to the actual situation. When the transistor is turned on, a voltage is applied to the source electrode 113 through the bit line 32 according to the externally input data, the source electrode 113 and the drain electrode 112 are turned on through the semiconductor layer 114, and the drain electrode 112 and the auxiliary electrode 116 are electrically connected. Therefore, the size of the voltage on the source electrode 113 and the drain electrode 112 is the same as that of the voltage on the auxiliary electrode 116. The node capacitor of the auxiliary electrode 116 with the drain electrode 112 forms the storage capacitor 103 of the memory cell 101, and the size of the voltage on the auxiliary electrode 116 determines the amount of charge in the storage capacitor and further determines whether the binary of the data signal stored in the memory cell 101 is 0 or 1. When a high voltage (e.g., 5 V) is applied to the source electrode 113 through the bit line 32, the data "1" is written into the memory cell 101; and, when a low voltage (e.g., 0 V) is applied to the source electrode 113 through the bit line 32, the data "0" is written into the memory cell 101.

When the semiconductor memory device 10 is in a reading operation mode, a second voltage is applied to the gate electrode 115 through the word line 31, such that there is a voltage difference between the gate electrode 115 and the source electrode 113. Meanwhile, the size of the current on the bit line 32 (i.e., the output current of the transistor 11) is detected to realize data reading. Specifically, when the data previously stored in the memory cell 101 is "1", the auxiliary electrode 116 and the drain electrode 112 have a high potential. Under the joint action of the first voltage and the second voltage, the transistor 11 is in the on state, so an obvious current can be measured by the bit line 32. When an obvious current is measured, the read data is determined as "1". When the data previously stored in the memory cell 101 is "0", the auxiliary electrode 116 and the drain electrode 112 have a low potential. After the second voltage is applied to the gate electrode 115, the field effect transistor is still in the off state, so the current measured by the bit line 32 is very weak. In this case, the read data is determined as "0".

It is to be noted that the size of the threshold voltage of the transistor 11 is related to the size of the voltage on the auxiliary electrode 116 and the drain electrode 112. For an N-type field effect transistor (that is, the semiconductor layer 114 of the transistor 11 is made of an N-type semiconductor material), if the auxiliary electrode 116 and the drain electrode 112 have a higher potential, the threshold voltage is lower. That is, when the voltage difference between the gate electrode 115 and the source electrode 113 is smaller, the transistor 11 can still have a larger output current. If the auxiliary electrode 116 and the drain electrode 112 have a lower potential, the threshold voltage is higher. Therefore, when the same second voltage is applied to the gate electrode 115, as shown in FIGS. 1, 4 and 6, the size of the voltage on the auxiliary electrode 116 and the drain electrode 112 (i.e., whether the data written by the transistor is "1" or "0") will lead to a significant difference in the output current of the transistor 11 (i.e., the current measured by the bit line 32). The data can be read out from the memory cell 101 by detecting the current on the bit line 32. When the data written by the transistor 11 is "1", the output current of the transistor 11 is higher, and the read data is also "1"; and, when the data written by the transistor 11 is "0", the output current of the transistor 11 is extremely weak, so the read data is also "0".

It is to be noted that the numerical value of the second voltage may be determined according to the parameters of the field effect transistor and the size of the voltage applied to the auxiliary electrode 116 and the drain electrode 112 during the writing operation. It is to be noted that the numerical value of the second voltage should be appropriate (it should be between the threshold voltage of the transistor when storing "1" and the threshold voltage of the transistor when storing "0"). If the numerical value of the second voltage is not appropriate, the size of the output current of the transistor 11 when storing the data "1" (that is, the potential on the drain electrode 112 and the auxiliary electrode 116 is high) will be very close to the size of the output current of the transistor when storing the data "0" (that is, the potential on the drain electrode 112 and the auxiliary electrode 116 is low). As a result, during the reading operation, it is difficult to determine whether the read data is "0" or "1", which will affect the performance of the semiconductor memory device 10. In practical applications, the most appropriate value of the second voltage may be determined by experiment or simulation, such that the difference in the output current of the transistor 11 during the reading operation in different states is maximized to improve the reading performance.

By applying the embodiments of the present disclosure, at least the following beneficial effects can be achieved.

In the semiconductor memory device 10 provided by the present disclosure, one transistor is provided in each memory cell 101, a gate electrode 115 and an auxiliary electrode 116 are provided in the transistor 11, and the auxiliary electrode 116 is electrically connected to a drain electrode 112. During a writing operation, a first voltage is applied to the gate electrode 115 through the word line 31, and an electrical signal is then applied to the source electrode 113 through the bit line 32 according to the external input data. The source electrode 113 transmits the electrical signal to the drain electrode 112, the drain electrode 112 transmits to the electrical signal to the auxiliary electrode 116, and the node capacitor of the auxiliary electrode 116 with the drain electrode 112 is used as the storage capacitor of the memory cell 101, such that data writing is realized. During a reading operation, a second voltage is applied to the auxiliary electrode 116 through the word line 31 by using the influence of the voltage on the auxiliary electrode 116 on the threshold voltage of the transistor 11 (the size of the second voltage is between the threshold voltage of the transistor 11 when storing "1" and the threshold voltage of the transistor 11 when storing "0"), and data reading is realized by detecting the size of the output current of the field effect transistor. Therefore, the reading/writing of the data can be realized by providing only one transistor 11 in the memory cell 101, without providing additional transistors 11 or capacitor devices, such that the structure of the memory cell 101 is greatly simplified and it is advantageous to improve the integration and storage density of the semiconductor memory device 10.

In the embodiments of the present disclosure, the orthographic projections of the gate electrode 115, the auxiliary electrode 116, the source electrode 113 and the semiconductor layer 114 on the substrate 110 are all within the orthographic projection of the drain electrode 112 on the substrate 110, such that the area occupied by the transistor 11 can be reduced, the structure layout of the semiconductor memory device 10 becomes more compact and it is more advantageous for the integration of the device.

In the embodiments of the present disclosure, by allowing the auxiliary electrode 116 to surround the gate electrode 115, the area of the overlap regions of the gate electrode 115, the auxiliary electrode 116 and the semiconductor layer 114 can be increased to the greatest extent, and the influence of the auxiliary electrode 116 on the threshold voltage of the transistor 11 can thus be improved. That is, when the voltage on the auxiliary electrode 116 is different, a greater difference in the output current of the transistor can be caused by applying the same threshold voltage. Therefore, it is advantageous to distinguish the read data during the reading operation, and the accuracy of the read data is improved.

When the material of the semiconductor layer 114 is metal oxide, the leakage current of the transistor 11 may be smaller (when the metal oxide is IGZO, the leakage current is lower than or equal to $10^{-15}$ A), such that the speed of charge loss on the storage capacitor is reduced. Accordingly, the data storage time the semiconductor memory device 10 can be prolonged, and it is advantageous to reduce the refresh frequency and power consumption of the semiconductor memory device 10.

In the embodiments of the present disclosure, a plurality of memory cells 101 are arranged in an array to form an array module 102, and a plurality of array modules 102 are stacked to form a semiconductor memory device 10 of a stereoscopic structure, such that the area occupied by the semiconductor memory device 10 can be reduced while improving the storage capacity of the semiconductor memory device 10, and it is advantageous for the integration of the device.

In the description of the present disclosure, it should be understood that, the orientation or position relation indicated by terms "center", "upper", "lower", "front", "rear", "left", "right", "vertical", "horizontal", "top", "bottom", "inside", "outside" or the like is an orientation or position relation shown based on the drawings, merely for describing the present disclosure and simplifying the description, rather than indicating or implying that the specified device or element must have a particular orientation or be constructed and operated in a particular orientation. Therefore, it should not be interpreted as limitations to the present disclosure.

The terms "first" and "second" are merely for illustrative purpose, and should not be interpreted as indicating or implying the relative importance or implicitly indicating the number of the specified technical features. Therefore, the features defined by the terms "first" and "second" can explicitly or implicitly include one or more features. In the description of the present disclosure, unless otherwise stated, "a plurality of" means two or more.

In the description of the specification, specific features, structures, materials or characteristics can be combined appropriately in any one or more embodiments or examples.

The foregoing description merely shows some implementations of the present disclosure. It should be pointed out that, to a person of ordinary skill in the art, various improvements and modifications can be made without departing from the principle of the present disclosure, and these improvements and modifications shall be regarded as falling into the protection scope of the present disclosure.

What is claimed is:

1. A semiconductor memory device, comprising a substrate and a plurality of memory cells arranged on the substrate, each of the memory cells comprising a transistor, a bit line and a word line,
    the transistor comprises:
    a drain electrode arranged above the substrate;
    a gate electrode arranged above the drain electrode, the gate electrode being insulated from the drain electrode, the gate electrode being electrically connected to the word line;
    an auxiliary electrode arranged above the drain electrode and surrounding an outer sidewall of the gate electrode, the auxiliary electrode being insulated from the gate electrode, the auxiliary electrode being not overlapped with the gate electrode in a first direction perpendicular to an upper surface of the substrate, the auxiliary electrode being electrically connected to the drain electrode;
    a semiconductor layer surrounding the gate electrode, the semiconductor layer being insulated from the gate electrode and the auxiliary electrode, respectively, the semiconductor layer being electrically connected to the drain electrode; and
    a source electrode arranged above the auxiliary electrode and surrounding the outer sidewall of the gate electrode, the source electrode being electrically connected to the semiconductor layer and the bit line, respectively, the source electrode being insulated from the gate electrode and the auxiliary electrode, respectively.

2. The semiconductor memory device according to claim 1, wherein the semiconductor layer is arranged between the gate electrode and the auxiliary electrode.

3. The semiconductor memory device according to claim 1, wherein the auxiliary electrode is at least partially overlapped with the source electrode in the first direction.

4. The semiconductor memory device according to claim 3, wherein the auxiliary electrode is at least partially overlapped with the drain electrode in the first direction.

5. The semiconductor memory device according to claim 4, wherein an orthographic projection of the auxiliary electrode on the substrate is located within an orthographic projection of the drain electrode on the substrate.

6. The semiconductor memory device according to claim 4, further comprising a conductive connector, and the auxiliary electrode is electrically connected to the drain electrode through the conductive connector.

7. The semiconductor memory device according to claim 6, wherein the conductive connector surrounds the auxiliary electrode.

8. The semiconductor memory device according to claim 1, wherein the semiconductor layer comprises a monocrystalline semiconductor material, a polycrystalline semiconductor material or a metal oxide semiconductor.

9. The semiconductor memory device according to claim 8, wherein the metal oxide semiconductor contains IGZO, ITO or IWO.

10. An electronic device, comprising the semiconductor memory device according to claim 1.

11. A semiconductor memory device, comprising a substrate and a plurality of memory cells arranged on the substrate, each of the memory cells comprising a transistor, a bit line and a word line,
    the transistor comprises:
    a gate electrode located above the substrate, extending in a direction perpendicular to the substrate and connected to the word line, the gate electrode having an outer wall;
    a semiconductor layer at least partially surrounding the outer wall of the gate electrode and insulated from the gate electrode;
    a source electrode connected to the semiconductor layer and the bit line, respectively;
    a drain electrode connected to the semiconductor layer and spaced apart from the source electrode;
    an auxiliary electrode located between the source electrode and the drain electrode and insulated from the semiconductor layer,
    wherein the auxiliary electrode is connected with the drain electrode.

12. The semiconductor memory device according to claim 11, wherein an orthographic projection of the auxiliary electrode on the substrate and an orthographic projection of the source electrode and/or drain electrode on the substrate has an overlapping area.

13. The semiconductor memory device according to claim 11, wherein an orthographic projection of the auxiliary electrode on the substrate and an orthographic projection of the gate electrode on the substrate do not have an overlapping area.

14. The semiconductor memory device according to claim 11, wherein the auxiliary electrode is insulated from the semiconductor layer on an outer wall of the semiconductor layer.

15. The semiconductor memory device according to claim 14, wherein the auxiliary electrode surrounds the outer wall of the semiconductor layer.

16. The semiconductor memory device according to claim 11, wherein the source electrode is arranged around an outer wall of the semiconductor layer, the drain electrode is arranged around the outer wall of the semiconductor layer, and the auxiliary electrode is arranged around the outer wall of the semiconductor layer.

17. The semiconductor memory device according to claim 16, wherein an orthographic projection of the source electrode on the substrate is within an orthographic projection of the auxiliary electrode on the substrate.

18. The semiconductor memory device according to claim 16, wherein the orthographic projection of the auxiliary electrode on the substrate is within an orthographic projection of the drain electrode on the substrate.

* * * * *